United States Patent
Mikhemar et al.

(10) Patent No.: US 9,214,918 B2
(45) Date of Patent: Dec. 15, 2015

(54) POWER DISTRIBUTING DUPLEXER SYSTEM

(71) Applicant: BROADCOM CORPORATION, Irvine, CA (US)

(72) Inventors: Mohyee Mikhemar, Aliso Viejo, CA (US); Hooman Darabi, Laguna Niguel, CA (US)

(73) Assignee: Broadcom Corporation, Irvine, CA (US)

( * ) Notice: Subject to any disclaimer, the term of this patent is extended or adjusted under 35 U.S.C. 154(b) by 407 days.

(21) Appl. No.: 13/716,005

(22) Filed: Dec. 14, 2012

(65) Prior Publication Data

US 2013/0241670 A1    Sep. 19, 2013

Related U.S. Application Data

(63) Continuation-in-part of application No. 13/419,631, filed on Mar. 14, 2012, now Pat. No. 8,854,155.

(60) Provisional application No. 61/732,850, filed on Dec. 3, 2012.

(51) Int. Cl.
| | |
|---|---|
| H03H 7/46 | (2006.01) |
| H03H 7/38 | (2006.01) |
| H02J 17/00 | (2006.01) |
| H04B 1/52 | (2015.01) |
| H04B 1/04 | (2006.01) |
| H04B 1/18 | (2006.01) |
| H04B 1/525 | (2015.01) |

(52) U.S. Cl.
CPC H03H 7/38 (2013.01); H02J 17/00 (2013.01); H04B 1/0458 (2013.01); H04B 1/18 (2013.01); H04B 1/52 (2013.01); H04B 1/525 (2013.01); H03H 7/463 (2013.01)

(58) Field of Classification Search
CPC ... H03H 7/38; H03H 7/383; H03H 2007/386; H03H 7/40; H03H 7/463; H03H 7/465
USPC .................................. 333/124, 126, 129, 131
See application file for complete search history.

(56) References Cited

U.S. PATENT DOCUMENTS

| | | | |
|---|---|---|---|
| 5,986,617 A * | 11/1999 | McLellan | 343/860 |
| 2004/0100341 A1* | 5/2004 | Luetzelschwab et al. | 333/32 |
| 2009/0175378 A1* | 7/2009 | Staszewski et al. | 375/295 |
| 2012/0013387 A1* | 1/2012 | Sankaranarayanan et al. | 327/355 |
| 2012/0154070 A1* | 6/2012 | Camp, Jr. | 333/32 |

* cited by examiner

Primary Examiner — Robert Pascal
Assistant Examiner — Gerald Stevens
(74) Attorney, Agent, or Firm — McDermott Will & Emery LLP

(57) ABSTRACT

A power distributing duplexer system is provided. In some aspects, the system includes a duplexer configured to couple an antenna to a transmitter and a receiver. The system also includes a balancing network coupled to the duplexer. The balancing network includes a network impedance. The balancing network is configured to adjust the network impedance to match an antenna impedance of the antenna. The balancing network includes a plurality of balancing network modules coupled to the duplexer. Each of the plurality of balancing network modules is configured to receive a portion of an output voltage from the duplexer.

20 Claims, 15 Drawing Sheets

US 9,214,918 B2

POWER DISTRIBUTING DUPLEXER SYSTEM

CROSS-REFERENCES TO RELATED APPLICATIONS

This application claims the benefit of U.S. Provisional Patent Application No. 61/732,850, filed on Dec. 3, 2012, and is a continuation-in-part application of U.S. patent application Ser. No. 13/419,631, filed on Mar. 14, 2012, both of which are hereby incorporated by reference in their entirety for all purposes.

TECHNICAL FIELD

This disclosure relates to systems and methods (generally referred to as systems) utilizing an adjustable duplexer system.

BACKGROUND

Electronic devices communicate with each other in various ways. For example, electronic devices may transmit or receive electro-magnetic signals carrying information or data. The electro-magnetic signals may be transmitted or received at one or more frequencies. As communication networks become more complex, it may be desirable for electronic devices to be able to communicate with each other over or using different frequencies while maintaining compact or efficient dimensions.

BRIEF DESCRIPTION OF THE DRAWINGS

The system may be better understood with reference to the following drawings and description. In the figures, like reference numerals designate corresponding parts throughout the different views.

DETAILED DESCRIPTION

Figure 1:
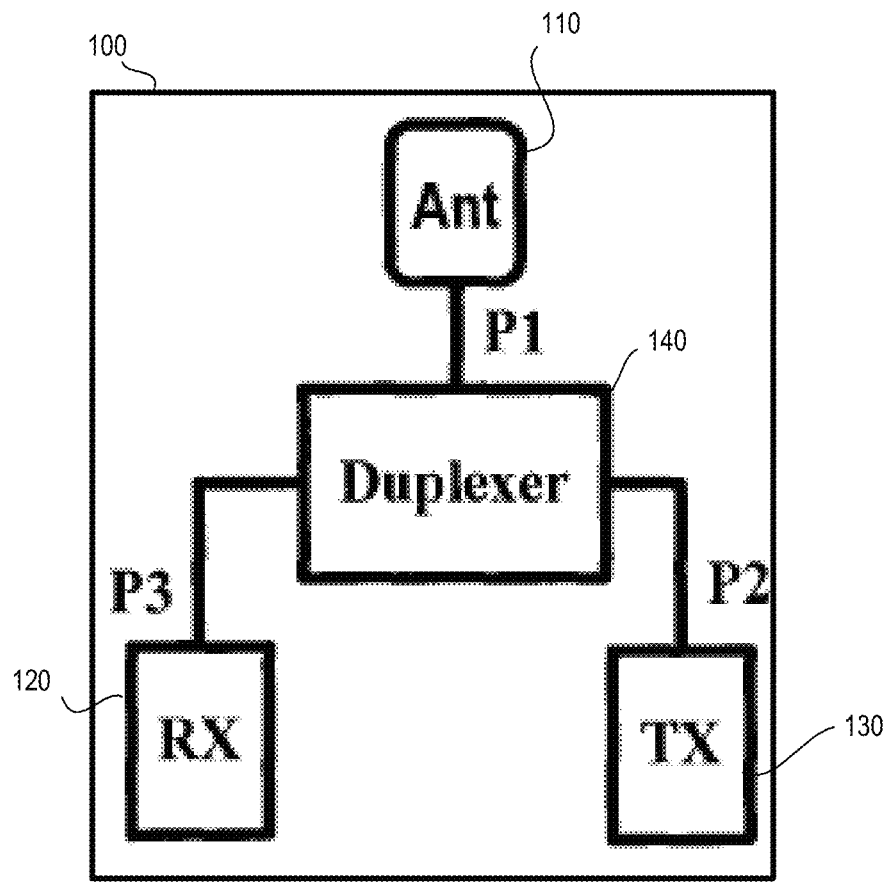
FIG. 1 is a block diagram of an example electronic device.

FIG. 1 is an example of an electronic device 100. Electronic devices, such as the electronic device 100, may, for example, be or include one or more of a cellular phone, a smart phone, a mobile phone, various other types of phones, a computer, a processor, a smart device, a personal digital assistant ("PDA"), a tablet, a storage device, a server, a device configured to communicate with one or more other devices or networks, or various other devices having a transmitter and a receiver.

The electronic device 100 may include an antenna 110, through which the electronic device 100 may receive and transmit signals to one or more other devices, processors, receivers, antennas, or networks. The antenna 110 may be configured or otherwise operable to communicate or receive signals at many frequencies and over a wide range of frequencies. For example, the antenna 110 may be configured to communicate over any cellular or radio frequencies. As another example, the electronic device 100 or antenna 110 may support, for example 3G/4G bands I, II, III, IV, and IX. Other variations are possible.

The electronic device 100 may include one or more receivers 120 ("RX"). A receiver 120 may be configured to detect and receive signals transmitted to or received by the electronic device 100. The receiver 120 may be configured to process signals received by the electronic device 100. The receiver 120 may receive signals at various power levels, such as at −110 dBm.

The electronic device 100 may include one or more transmitters 130 ("TX"). A transmitter 130 may be configured to send or transmit one or more signals to the one or more other devices or networks, by or through the antenna 110. The transmitter 130 may, in some instances, operate using a frequency which may be different than the frequency used by the receiver 120.

The transmitter 130 may be connected to one or more power amplifiers ("PA"). The power amplifiers may be positioned between the transmitter 130 and the antenna 110 or between the transmitter 130 and a duplexer. The power amplifiers may amplify the power of a signal to be transmitted by the transmitter 130. The transmitter 130 may transmit signals at various power levels, such as at +28 dBm. The power levels of the receiver 120 and the transmitter 130 may be different.

The electronic device 100 may include a duplexer 140. Examples of duplexers 140 may be or include an electronic balance duplexer ("EBD"), a division frequency duplexer, or another duplexer. The duplexer 140 may enable the receiver 120 and the transmitter 130 to share or otherwise both use the antenna 110, and may enable the receiver 120 and the transmitter 130 to operate at the same time. The duplexer 140 may be configured to enable the electronic device 100 to receive and transmit at the same time. For example, an EBD duplexer may perform electrical balance by subtracting a transmitting signal from an antenna input to isolate a receiver signal. This type of balancing may not assume or require any relationship between the RX and TX frequencies. Rather, the TX and RX signals may remain isolated even if they share a frequency band. Other examples are possible.

The duplexer 140 may allow the electronic device 100, which may be a cell phone or Wi-Fi capable device, to receive and transmit signals at the same time. For example, a 3G cellular phone may be or include a frequency division duplexing ("FDD") system where a transmitter 130 and a receiver 120 are both active simultaneously. Other examples are possible.

The duplexer 140 may include one or more filters, such as one or more bandpass filters or radio frequency ("RF") surface acoustic wave ("SAW") filters. Each filter in the duplexer 140 may pass one or more frequency bands of a signal while attenuating noise at frequencies that are not passed. For example, a filter may allow frequencies of a signal with a range, such as between 2.1 GHz and 2.2 GHz, to pass, while rejecting or otherwise attenuating signals below 2.1 GHz and greater than 2.2 GHz. Other examples and filter types are possible.

Where the electronic device 100 operates with different frequencies or frequency bands, separate filters or duplexers may be needed for each frequency or frequency band. For example, the receiver 120 may operate at a first frequency band, such as at 2.14 GHz, while the transmitter 130 may operate at a second frequency band, such as at 1.95 GHz. The duplexer 140 in this example may include two very sharp RF SAW filters—one RF SAW filter to pass the transmitting frequency band while filtering receiver band noise, and the other RF SAW filter to pass the receiving frequency band while filtering transmitter band noise. Other variations are possible.

A duplexer 140 may be constructed in various ways or include various components. For example, the duplexer 140 may be a three port duplexer 140, with one port for the antenna 110, one port for the receiver 120, and one port for the transmitter 130. The duplexer 140 may be arranged as a reciprocal circuit or reciprocal network with reciprocal circuit elements, such as resistors, capacitors, inductors, coupled inductors, or other circuit element that have interchangeable terminals. The duplexer 140 may, for example, be a 3-port lossy electronic balance duplexer.

The S-parameters of a reciprocal network satisfy the relation: $S_{ij}=S_{ji}$ for all i and j. A reciprocal duplexer 140 having infinite isolation and all duplexer ports matched may have an S-matrix in the form of:

$$S_{EBD\_reciprocal} = \begin{pmatrix} 0 & S_{12} & S_{13} \\ S_{12} & 0 & 0 \\ S_{13} & 0 & 0 \end{pmatrix}$$

$S_{EBA\_reciprocal}$ may not be a unitary matrix and may represent the lossy network. Reciprocity may dictate or require that an insertion loss from any port to any other port be the same in both directions.

Figure 2:
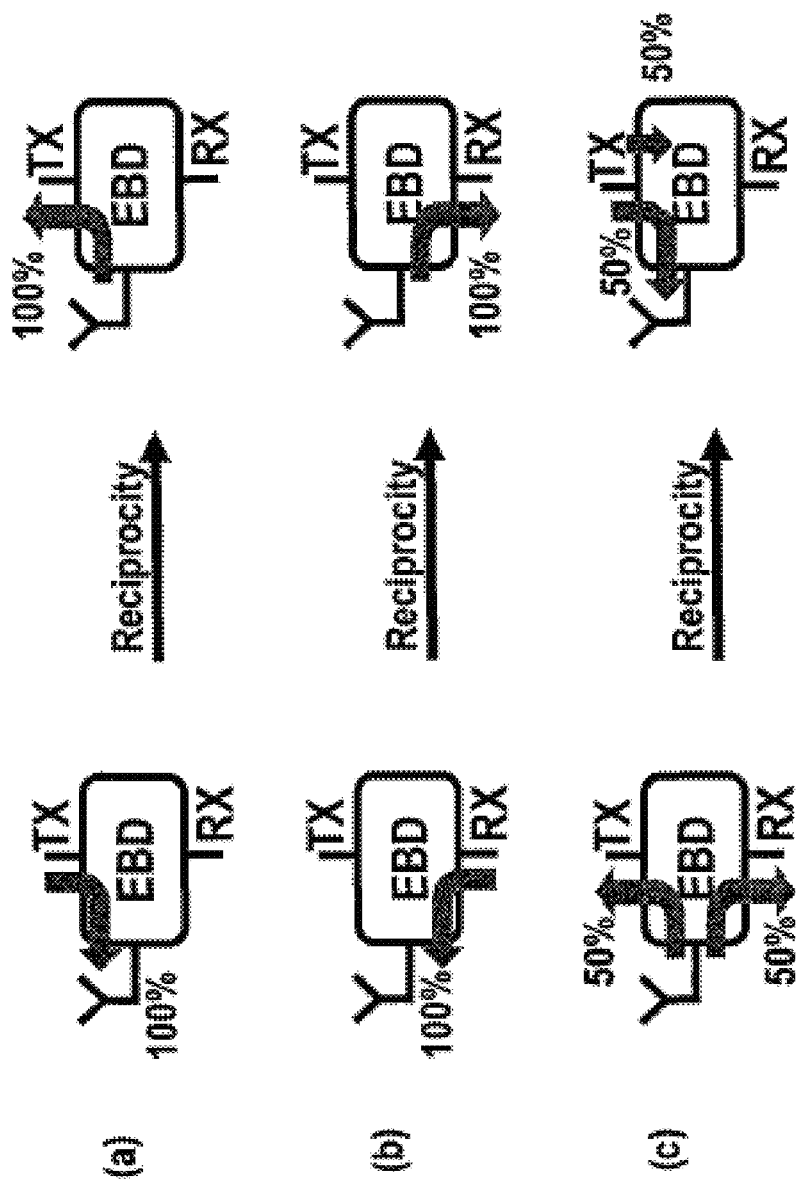
FIGS. 2a-2c are diagrams of losses in an example duplexer system.

FIGS. 2a-2c show losses experienced for a 3-port duplexer. For example, FIG. 2a shows a 0 dB insertion from transmitter to antenna. 100% of the power applied from the transmitter port is directed to antenna, and by reciprocity, 100% of the power applied at the antenna is directed to the transmitter and 0% to the receiver. So 0 dB insertion loss in the transmitter path results in infinite insertion loss for the receiver path. The reverse case is shown in FIG. 2b, where a 0 dB receiver insertion loss results in infinite transmitter loss. A 0 dB insertion for both the transmitter and receiver simultaneously may not be realizable. FIG. 2c shows an alternative example where the incident power from the antenna is divided between the receiver and transmitter equally, 50% each. By reciprocity, 50% from the power applied from transmitter is directed to antenna, and since the transmitter and receiver are isolated, the remaining 50% of the power is dissipated in the duplexer.

Figure 3:
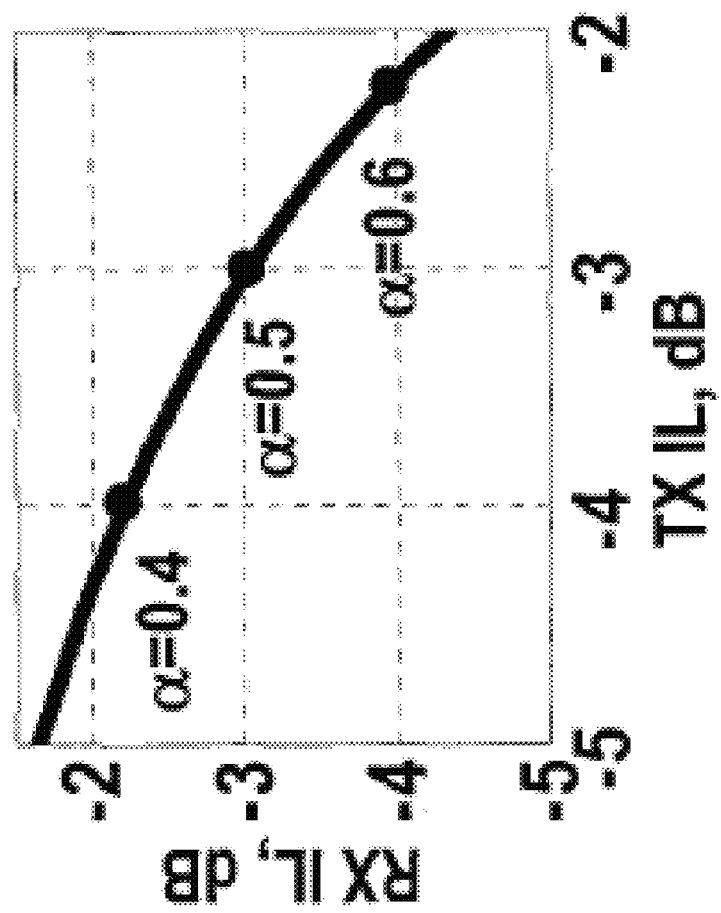
FIG. 3 is a chart of insertion loss tradeoffs in an example duplexer system.

FIG. 3 illustrates a graphical representation of the trade-off between the transmitter insertion loss and the receiver insertion loss for a reciprocal EBD such as the duplexer 140. The power applied at any port in the 3-port duplexer 140 is divided between the two adjacent ports. Opposite ports are isolated. In a symmetrical case, with α=0.5, the receiver insertion loss ("RX IL") equals the transceiver insertion loss ("TX IL"), and both equal 3 dB. The EBD duplexer 140 can be altered such that the antenna favors either the receiver or the transmitter with lower loss for one, at the expense of higher loss for the other.

An electronic device 100 may be configured or operable to receive signals at more than one frequency or frequency band. An electronic device 100 that receives signals at multiple different frequency bands may require a duplexer 140 for each supported frequency band. In addition, for each frequency band that is supported by an electronic device 100, the electronic device 100 may need or use a specific or unique low noise amplifier ("LNA"). In many electronic devices 100, LNA's may not be shared, and as such, these electronic devices may need many ports to support the frequency bands.

Figure 4:
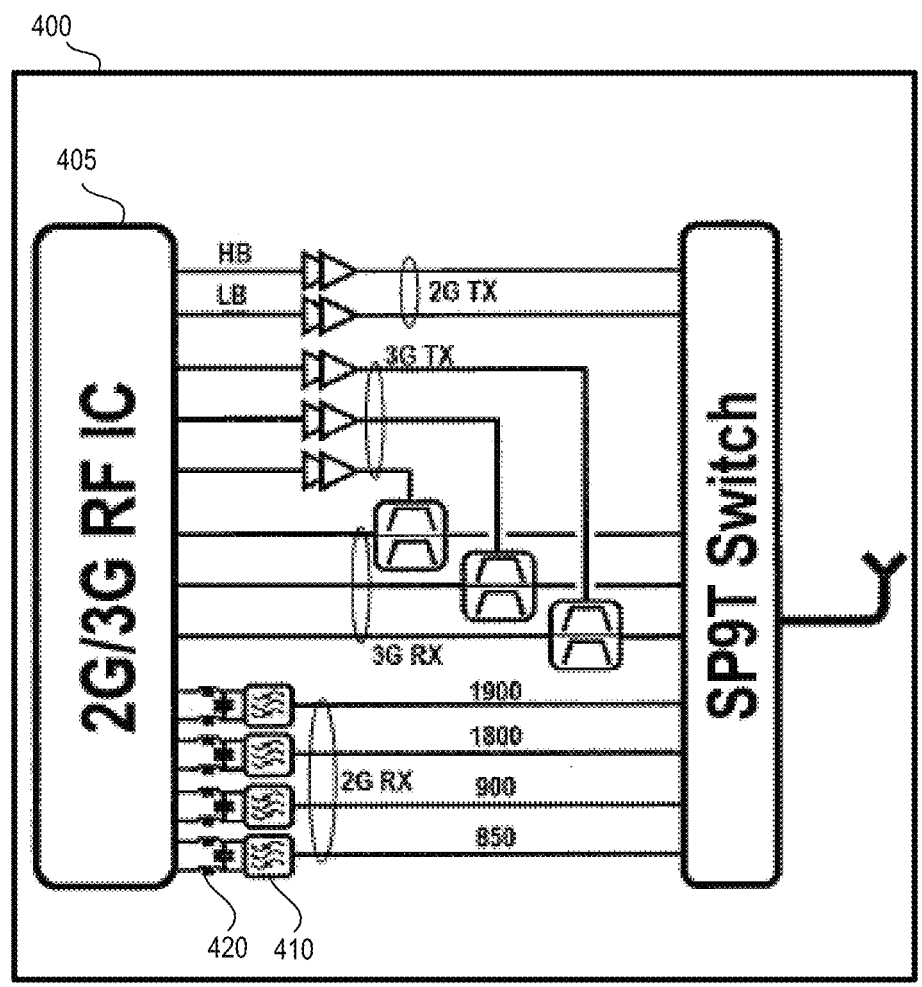
FIG. 4 is a block diagram of an example electronic device.

For example, 2G/3G cellphones may receive signals at many different frequencies. FIG. 4 shows one example of a 2G/3G radio frequency device 400. The 2G/3G radio frequency device 400 may include an integrated circuit ("IC") 405 that may operate in a 2G/3G cellphone. The IC 405 may support four 2G bands and three 3G bands. The IC 405 may include one or more of a radio frequency transceiver, four SAW filters (such as SAW filter 410), twelve matching components (such as matching component 420) needed for the 2G receiver ("2G RX"), and two power amplifiers ("PA") for 2G. The IC 405 may also or alternatively include duplexers and PAs for 3G, which may dominate the area of the electronic device 400. Other examples of the electronic device 400 handling different frequencies are possible.

As the electronic device 400 supports more frequency bands, additional duplexers 140, filters, and other hardware may need to be included with the electronic device. As new cell phones are produced and more frequency bands are used, expanding the size of the electronic device 400 with additional duplexers and filters may be difficult. Accordingly, electronic devices with an adjustable or tunable duplexer capable of handling different frequencies may be advantageous in reducing a number of necessary duplexers and a size of IC 405 used in the electronic device 400.

Figure 5:
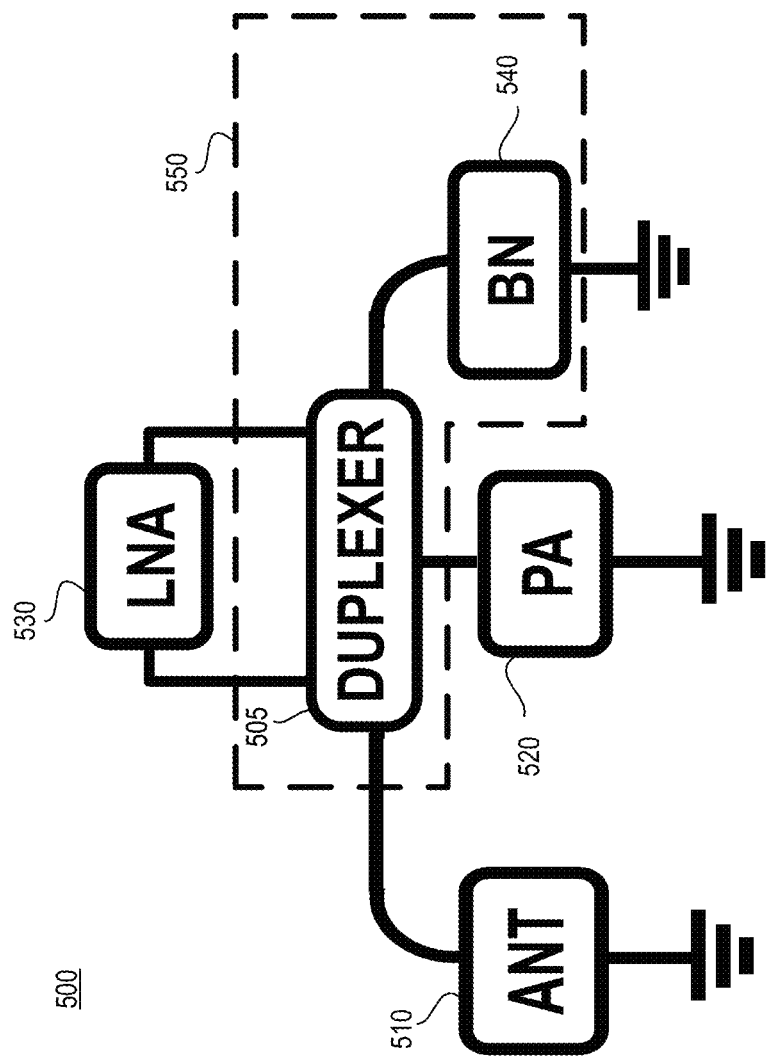
FIG. 5 is a block diagram of an example electronic device with an example duplexer system.

FIG. 5 shows an example of a portion of an electronic device 500 with a duplexer system 550 (sometimes referred to as "duplexing system" or simply "duplexer") that may be adjustable and tunable. The electronic device 500 may include an antenna 510, a power amplifier 520 connected or associated with the transmitter, and a low noise amplifier 530 (sometimes referred to as "LNA") connected or associated with the receiver. In other systems, the low noise amplifier 530 may be removed or replaced by various other amplifiers, receivers, or other components. In other systems, the duplexer system 550 and the low noise amplifier 530 may be interchanged or flipped in position, such that the low noise amplifier 530 may be connected with the antenna 510 and a balancing network ("BN") 540. Other variations are possible.

The duplexer system 550 of the electronic device 500 may include a four port duplexer 505. The four port duplexer 505 may be a lossless reciprocal network. Each of the antenna 510, power amplifier 520, and low noise amplifier 530 may be connected to a different port of the duplexer 505. The fourth port termination of the duplexer 505 may be a balancing network 540. The balancing network 540 may balance the power consumption such that the conservation of energy throughout the duplexer system 550 is satisfied.

The duplexer system 550 may be arranged as a reciprocal circuit or reciprocal network with reciprocal circuit elements, such as resistors, capacitors, inductors, coupled inductors, or other circuit elements that have interchangeable terminals. The duplexer system 550 may refer to the duplexer 505 and the balancing network 540. Other variations are possible.

Figure 6:
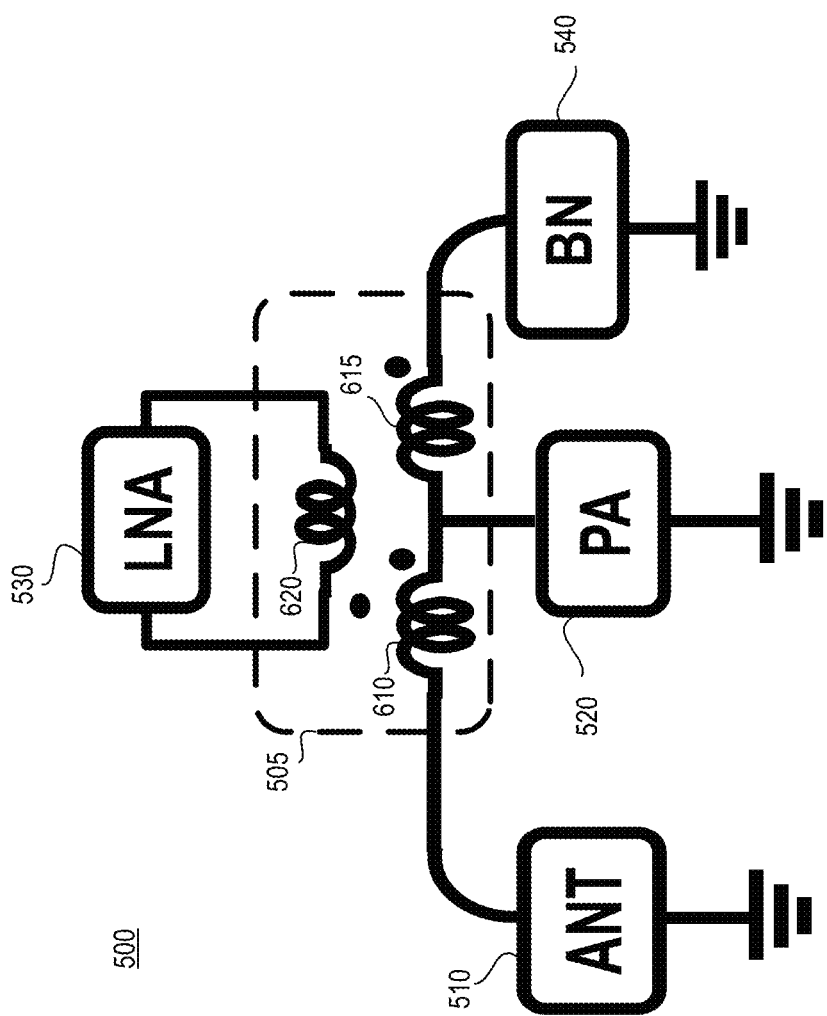
FIG. 6 is a block diagram of an example electronic device with an example duplexer system.

FIG. 6 shows the electronic device 500 with some example components of the duplexer 505. The duplexer 505 may, for example, include one or more inductors, such as the inductors 610, 615, and 620. Two inductors 610 and 615 may be arranged or configured between the antenna 510 and balancing network 540, with the power amplifier 520 connected between them. The inductors 610 and 615 may form a symmetry in the circuit.

In some systems, the inductors 610 and 615 may be two different inductors. In other systems, a one large inductor may make up the two inductors 610 and 615. In these systems, the power amplifier 520 may be attached to a point between the one large inductor, creating two separate inductors 610 and 615 on either side of the point at which the power amplifier 520 is connected. When the power amplifier 520 is connected in the middle, the two inductors 610 and 615 may be identical. When the power amplifier 520 is not connected in the middle, the two inductors 610 and 615 may have different inductances, which may depend on where the power amplifier 520 is connected. Other examples of inductors 610 and 615 are possible.

In addition to the two inductors 610 and 615, the low noise amplifier 530 may additionally include an inductor 620 of the duplexer 505. The arrangement and properties of the inductors 610, 615, and 620, such as the impedance or number of turns in the inductors 610, 615, and 620, may operate to attenuate a power output from the power amplifier 520 before the signal reaches the low noise amplifier 530. The inductors 610, 615, and 620 may operate as a transformer (such as an autotransformer). Other configurations or examples of the duplexer 505 and duplexer components are possible.

An antenna 510 of an electronic device 500 may have varying impedance values. For example, the antenna 510 may have a different impedance value depending on the frequency of a signal that the antenna 510 is communicating with and the physical surrounding of the antenna affecting the near field.

The duplexer system 550 may implement or use a passive or active balancing network 540 which may be tunable or adjustable. The balancing network 540 may be used to match an antenna impedance and/or isolate the power amplifier 520 from the low noise amplifier 530.

The balancing network 540 may have or include one or more adjustable or modifiable capacitance or inductance components or adjustable or modifiable resistance components. The modifiable or tunable balancing network 540 may beneficially enable the duplexer system 550 to isolate the power amplifier 520 and the low noise amplifier 530 for many different frequencies and antenna impedances. The duplexer system 550 may thus be, include, or represent a multi-band duplexer, and may be capable of performing duplexing that would otherwise require multiple duplexers 140. The use of a duplexer system 550 that is configured or operable to be adjusted and used for handling various receiving frequencies may offer flexibility in electronic device design and reduce a number or amount of components needed in designing communication devices.

An example of a passive balancing network 540 may be a network made up of elements that may not need or require any bias current or voltage to operate. For example, a passive balancing network may include one or more inductors, capacitors, resistors, and metal-oxide semiconductor ("MOS") switches. The 4-port lossless reciprocal network with a resistor for the balancing network 540 may have an S-matrix given by:

$$S = \begin{pmatrix} 0 & S_{12} & S_{13} & 0 \\ S_{12} & 0 & 0 & |S_{13}|e^{j\theta_1} \\ S_{13} & 0 & 0 & |S_{12}|e^{j\theta_2} \\ 0 & |S_{13}|e^{j\theta_1} & |S_{12}|e^{j\theta_2} & 0 \end{pmatrix}$$

Where $S_{12}$ and $S_{13}$ satisfy $|S_{21}|^2 + |S_{31}|^2 = 1$. In implementations with a passive balancing network 540, a receiver insertion loss may add directly to a receiver cascaded noise figure (sometimes referred to as "RX NF").

Figure 7:
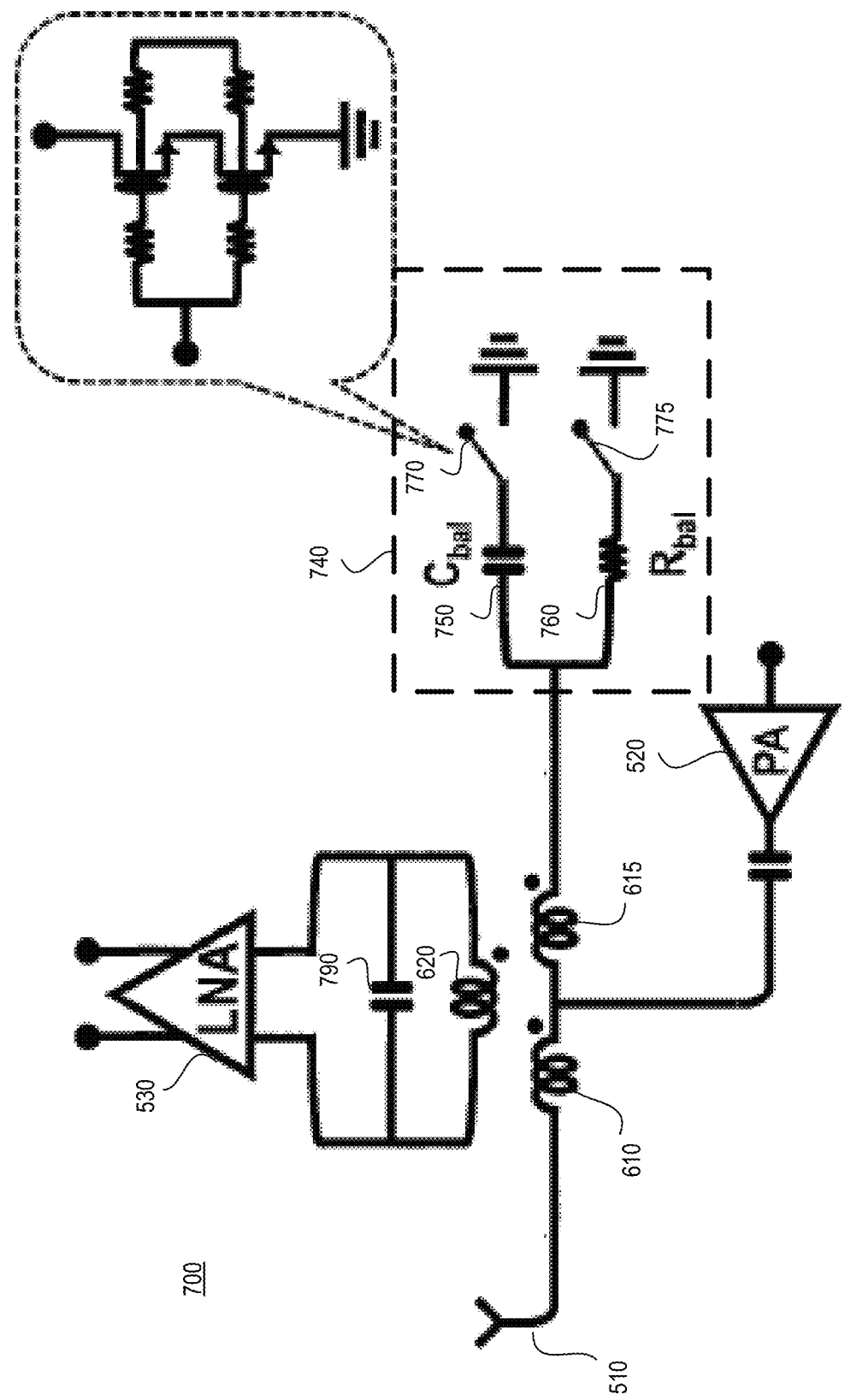
FIG. 7 is a block diagram of an example electronic device with an example duplexer system.

FIG. 7 shows an example of an electronic device 700 with a duplexer system 550 having a passive balancing network 740. The balancing network 740 may include a capacitor 750 (sometimes referred to as "capacitance component") and a resistor 760 (sometimes referred to as "resistance component" or "resistive component"). While only one capacitor 750 and one resistor 760 are shown, an active balancing network 740 may include a set of multiple resistors which may, for example, be selected or connected using one or more switches, and a set of multiple capacitors which may, for example, be selected or connected using one or more switches. For example, the balancing network 740 may include a switchable bank of ten (or any number) resistors of different resistance values, any one or more of which may be selected and connected to obtain a given resistance value, and also may include a switchable bank of five (or any number) capacitors of different capacitance values, any one or more of which may be selected and connected to obtain a desired capacitance value.

The capacitor 750 and resistor 760 may be connected in parallel, series, or some combination of parallel and series. Each capacitor 750 may contribute a capacitance or reactive impedance to an overall impedance of the balancing network 740. Each resistor 760 may contribute a resistance or real impedance to an overall impedance of the balancing network 740. In some devices, the balancing network 740 may additionally or alternatively include one or more inductors or an inductive component which may contribute to an overall impedance of the balancing network. Other variations of the balancing network 740 are possible.

The adjustable balancing network 740 may also or alternatively include one or more switches 770 and 775, which may be used to control a capacitance or resistance value of the overall impedance of the balancing network 740. The one or more switches of a balancing network 740 may be made or created using one or more Complementary metal-oxide-semiconductors ("CMOS"). For example, a stack of two thick oxide switches with an AC-floating body may be implemented, and can tolerate certain voltages swings reliably for 10 years of operation. Other examples are possible.

In other devices, a balancing network 740 may include one or more adjustable or modifiable capacitors as the capacitance component and/or one or more adjustable or modifiable resistors as the resistance component. The adjustable or modifiable capacitor may have or contribute a capacitance to an impedance of the balancing network 740. The modifiable capacitor may be monitored, adjusted, modified, or otherwise changed to contribute a capacitance value to an overall impedance of the balancing network 740. The adjustable or modifiable resistor may have or contribute a resistance to an impedance of the balancing network 740. The modifiable resistor may be monitored, adjusted, modified, or otherwise changed to contribute a resistance value to an overall impedance of the balancing network 740.

By controlling one or more capacitance components or resistive components (such as by controlling the capacitor 750 and resistor 760 with switches 770 and 775), the balancing network 740 may be configured or operable to control the impedance of the balancing network 740. As such, the balancing network 740 may be modified, adjusted, or altered to provide many different impedance values. In some systems, a processor, logic, computer readable medium with instructions, or a controller may be configured or operable to monitor, determine, set, or otherwise control the adjustable capacitance and adjustable resistance of the balancing network 740, thereby setting and adjusting an overall impedance of the balancing network 740.

The adjustable impedance of the balancing network 740 may be used in various ways. For example, the impedance of the balancing network 740 may be adjusted or modified to isolate the power amplifier 520 from the low noise amplifier 530. Where the power amplifier 520 is isolated from the low noise amplifier 530, half of the power in the duplexer 505 is spent, burned, or used in the components of the antenna 510, and the other half are spent, burned, or used in the balancing network 540. Continuous infinite isolation of the power amplifier 520 and low noise amplifier 530, regardless of a frequency or changing impedance of an antenna 510, may be accomplished in various ways, such as by ensuring that the voltage difference between the inductors 610 and 615 is zero, or minimized The balancing network 740 may monitor and adjust the balancing network impedance continuously, nearly continuously, at intervals, during or after certain periods of time, when prompted, when triggered, or at various other times.

In some configurations, the inductors 610 and 615 of duplexer 505 may be identical or have the same impedance. In these configurations, the balancing network 740 may perform isolation by monitoring the variable impedance of the antenna 510 (sometimes referred to as "antenna impedance"). The impedance of the balancing network 740 may be adjusted, such as by a controller or processor, to be the same as the monitored impedance of the antenna 510. The impedance of the balancing network 740 may thus mirror, track, and mimic any changes in impedance of the antenna 510.

When an impedance of the antenna 510 changes, such as when the antenna 510 is communicating over a different frequency or where the antenna has been moved or changes position, the impedance of the balancing network 740 may also change to track the change in the antenna impedance. In doing so, the balancing network 740 may ensure that a voltage drop over the antenna 510 is the same as the voltage drop over the balancing network 740. If the voltage drops over the antenna 510 and the balancing network 740 are the same, the difference between the voltages between the two identical inductors 610 and 615 may be zero and the power amplifier 520 may be isolated from the low noise amplifier 530. In this way, the duplexer system 550 may be tunable or adjustable to accommodate communications with the antenna 510 at various different frequencies or frequency bands.

In other configurations, the impedances of the two inductors 610 and 615 may not be identical. For example, one inductor 610 may have an inductance of N1 while the second inductor 615 may have a second, different inductance N2. In these configurations, the balancing network 740 may ensure a zero voltage difference between the inductors 610 and 615 in various other ways.

In a first example, the balancing network 740 may continue to monitor the impedance of the antenna 510 or a voltage drop over the antenna 510. However, because the impedances of the inductors 610 and 615 may be different, the balancing network 740 may not achieve isolation of the low noise amplifier 530 by merely mimicking the impedance of the antenna 510. Rather, the balancing network 740 or a controller of the balancing network may apply one or more algorithms or functions that factor in the differences between the known impedances of the inductors 610 and 615. Based on the impedance of the antenna 510 and the known impedances, the algorithms or functions may be used to calculate or otherwise determine an impedance of the balancing network 740 that will create a zero voltage difference and isolate the low noise amplifier 530 and the power amplifier 520.

As an alternative example, a voltage difference between the inductors 610 and 615 may be measured directly, and the impedance of the antenna 510 may be ignored. In this example, the balancing network 740 or a controller of the balancing network 740 may apply one or more algorithms or functions that may factor the measured voltage drop and the known impedances of the inductors 610 and 615 to calculate a necessary change in the balancing network 740 to create a zero voltage drop. Other examples and methods of isolating the low noise amplifier 530 and the power amplifier 520 are possible.

Isolation may, in some implementations, be limited by the resolution of the balancing impedance. Where an adjustable capacitance component and an adjustable resistive component are included in the balancing network 740, isolation may only be limited by limits of the adjustability of the capacitance component and the resistive component. Where the balancing network 740 is implemented as variable impedance using switchable banks of resistors and capacitors, the impedance may be limited by the available combinations of resistors and capacitors in the switchable banks. The electronic device 700 may have various properties, such as a transmitter insertion loss, a receiver insertion loss, and a receiver noise figure (sometimes referred to as "RX NF"). The transmitter insertion loss may refer to an amount of power that goes to an antenna 510 from power that is output from a power amplifier 520. The receiver insertion loss may refer to an amount of power that goes to the low noise amplifier 530 from the power coming from the antenna 510.

In addition or alternative to balancing an antenna impedance or isolating a power amplifier from a low noise amplifier, an electronic device 700 may be operable to provide small insertion losses or noise figures. The transmitter insertion loss and receiver insertion loss of an electronic device 700 may have or experience a tradeoff, as shown in FIG. 3. The tradeoff may depend on the inductances of the inductors 610 and 615 of the duplexer 505. If the inductors 610 and 620 are the same ($\alpha=0.5$), the transmitter insertion loss should equal the receiver insertion loss. In this example, both insertion losses are approximate 3 dB, because half of the power put out by the power amplifier 520 may be spent, burned, or used over the balancing network 540. An increase in the inductance of one of the inductors 610 or 615 will shift the tradeoff, such that one of the insertion losses (either TX or RX) will improve while the other insertion loss (RX or TX) will worsen.

In some systems, the receiver noise figure may be a more important parameter than a receiver insertion loss. For example, an operator of a receiver may be more interested in a signal-to-noise ratio than an absolute power level. The receiver noise figure may refer to or provide an indication of how much noise the receiver is receiving and how sensitive the receiver is.

The receiver noise figure may vary with or otherwise be directly related to the resistance of the balancing network 740. The receive noise figure may indicate a resistance seen at the low noise amplifier 530. The resistance at the low noise amplifier 530 may include a resistance from the antenna 510, and a resistance from the balancing network 740.

Where the balancing network is a passive balancing network, such as with the balancing network 740, a resistance in a passive balancing network may be varied or adjusted in a limited number of ways, such as by either adjusting a set resistance for the passive balancing network or according to environmental changes, such as a temperature. As such, the balancing network 740 may have little or no freedom to change the noise figure once a resistance is set for the isolation. In implementations with a passive balancing network 740, the receiver insertion loss may add directly to a receiver cascaded noise function, because the duplexer system 550 is passive, and regardless of implementation, the available noise power will depend only on the real part of the impedance of the balancing network 740. In such devices, the transmitter insertion loss and the receiver noise figure may be optimized by having identical inductors 610 and 615, such that the transceiver loss is around 3 dB and the noise figure is minimized As an alternative to using a passive balancing network 740 where it may not be possible to break a 3 dB insertion loss limit, the duplexer system 550 may implement or use an active balancing network. An active balancing network may include one or more active elements which may use or require a bias voltage or current (for example, a direct current ("DC") bias current). For example, an active balancing network may include active components or active elements ("active components") like MOS transistors operating as transconductors and amplifiers or various other transistors. Active elements may be driven, powered, operated, or otherwise controlled using a bias current or voltage, which may control or initiate the transconductance of the active elements or components. In addition to one or more active elements, the active balancing network 540 may also include one or more passive elements. One or more components of an active balancing network 540 may be configured or operable to tolerate large voltage swings. A duplexer system with an active balancing network may be configured and operable achieve a noise figure of less than 3 dB and overcome a physical 3 dB limit.

Figure 8:
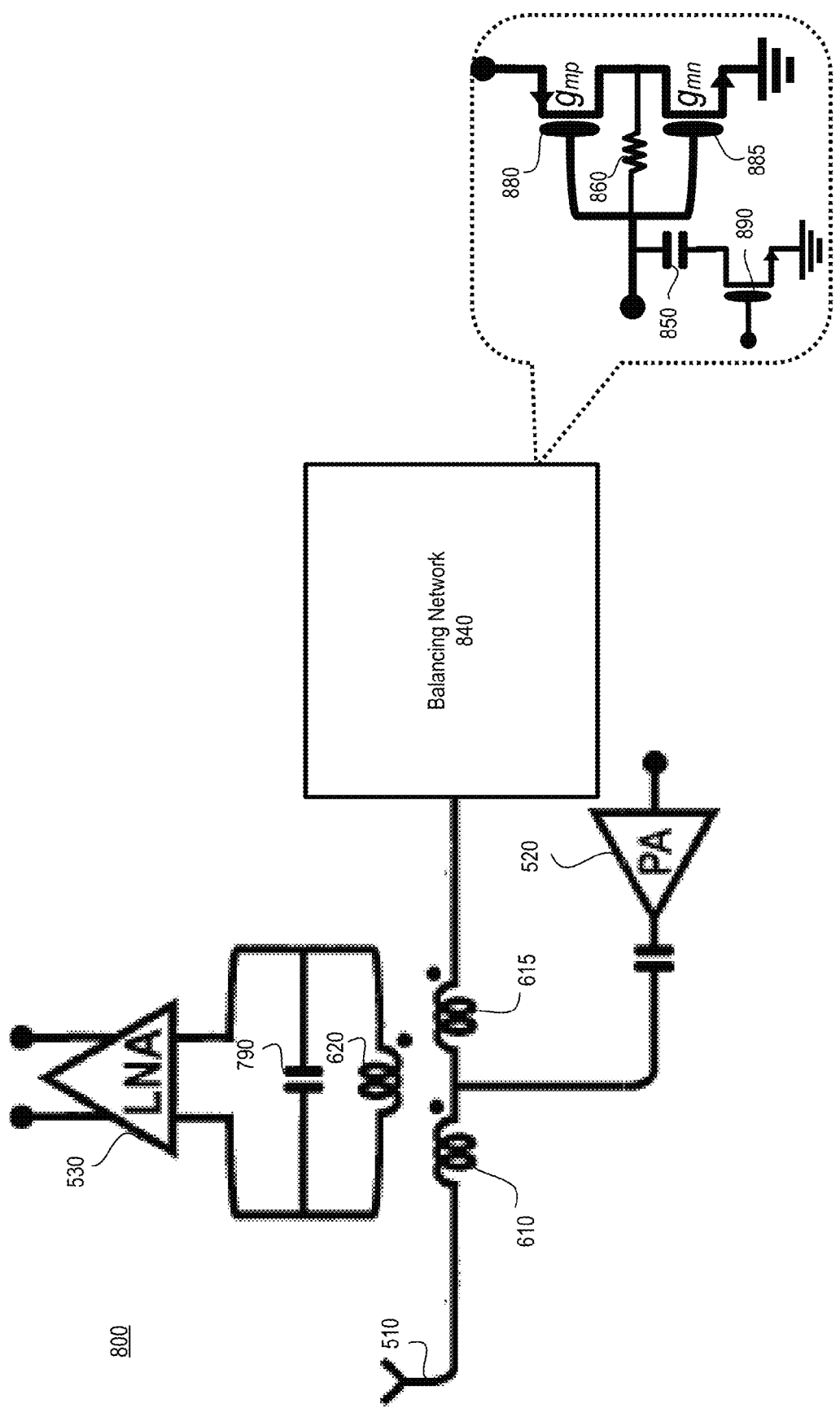
FIG. 8 is a block diagram of an example electronic device with an example duplexer system.

FIG. 8 shows an example of an electronic device 800 with a duplexer system having an active balancing network 840. The electronic device 800 may additionally or alternatively include one or more of an antenna 510, a power amplifier 520, a low noise amplifier 530, inductors 610, 615, and 620, and a capacitor 790, which may be the same as or similar to the antenna 510, power amplifier 520, low noise amplifier 530, inductors 610, 615, and 620, and capacitor 790 of the electronic device 700.

One example of circuitry for an active balancing network 840 is shown. The balancing network 840 may be a low noise balancing network. The low noise balancing network 840 may be configured and operable to enable the electronic device 800 to operate with very low loss.

The balancing network 840 may include or contain one or more passive components, such as one or more of a switch, capacitor 850, and resistor 860. In addition, the active balancing network 840 may include one or more active components, such as one or more transistors 880, 885, and 890. Examples of transistors that may be used or included with the active balancing network 840 may be or include a metal-oxide-semiconductor field-effect transistor ("MOSFET"), CMOS, junction gate field-effect transistors ("JFETs"), bi-polar junction transistors ("BJTs") or other transistors. The active balancing network 840 may be constructed or operable with various technologies, such as silicon, SOI, GaAs, InP, GaN, and various other technologies.

The balancing network circuitry shown in FIG. 8 is one example of an active balancing network. Other examples may include, for example, an inductively degenerated common source ("CS") LNA, a common gate LNA, a common gate LNA with feedback, a CS LNA with buffered feedback, or various other implementations. Various other circuits or combinations of components may be used to create the active balancing network 840.

An impedance of the active balancing network 840 may, for example, depend on a transconductance $g_{mp}$ and $g_{mn}$ of the transistors 880 and 885. For example, the resistance contribution from the transistors 880 and 885 to the impedance of the balancing network 840 may be:

$R_{in}=1/(g_{mn}+g_{mp})$

The transconductance $g_{mp}$ and $g_{mn}$ of the transistors 880 and 885 may vary with changes in bias current or bias voltage of the balancing network 840. A resistance and impedance of the balancing network 840 may thus be variable by changing the bias current or bias voltage of the active components of the balancing network, thereby changing an impedance of the active components. The transconductance of the transistors 880, 885, and 890 in the balancing network 840 may be controlled and modified to produce a desired resistance value. The active components of the balancing network 840 may enable the balancing network 840 to control and provide a minimum resistance value of the balancing network 840, while matching an antenna impedance or isolating the power amplifier 520 from the low noise amplifier 530.

By using active components in the balancing network 840, and controlling or minimizing a resistance of the balancing network 840, the balancing network 840 may enable a noise figure which may break the 3 dB theoretical noise limit. As an example, one or more of the inductors 610 and 615 may be modified to provide for a low transmitter insertion loss at the expense of a high receiver insertion loss. For example, a turns ratio of the two inductors 610 and 615 may be skewed by moving a tapping point (point which the power amplifier 520 connects between the two inductors 610 and 615) from the center (where the two inductors 610 and 615 are identical) to have different inductances of the two inductor spirals 610 and 615. Where the inductance of the two spirals is, for example, 5.6 nH and 3.7 nH, the transceiver insertion loss may be lowered to 2.5 dB, for example, at the expense of higher insertion loss for the receiver of 4.6 dB. To minimize the loss due to eddy currents in the substrate, the inductors 610 and 615 may, for example, be placed or realized in the uppermost layers of metal.

However, as the active balancing network 840 may operate to provide a resistance value based on the transconductance of the transistors 880, 885, and 890, the receiver noise figure may also be reduced. Since the noise voltage of the balancing network and the antenna appears differentially at the input of the low noise amplifier 530, the effective noise figure of the duplexer will be smaller, such as 1 dB. Physically, this reduced receiver noise figure may be obtained by spending, burning, or otherwise using more current as a bias current in one or more active components, such as the transistors 880, 885, and 890, in the balancing network 840. In this way, for example, it is possible with a passive 4-port duplexer and an active balancing network 840 to break the 3 dB performance limitation. As such, the balancing network 840 may realize a resistance value with a lower noise figure than in a passive balancing network. The quality factor of the elements in the balancing network 840 may only affect the insertion loss, but may not affect the isolation so long as a balance may be achieved.

Figure 9:
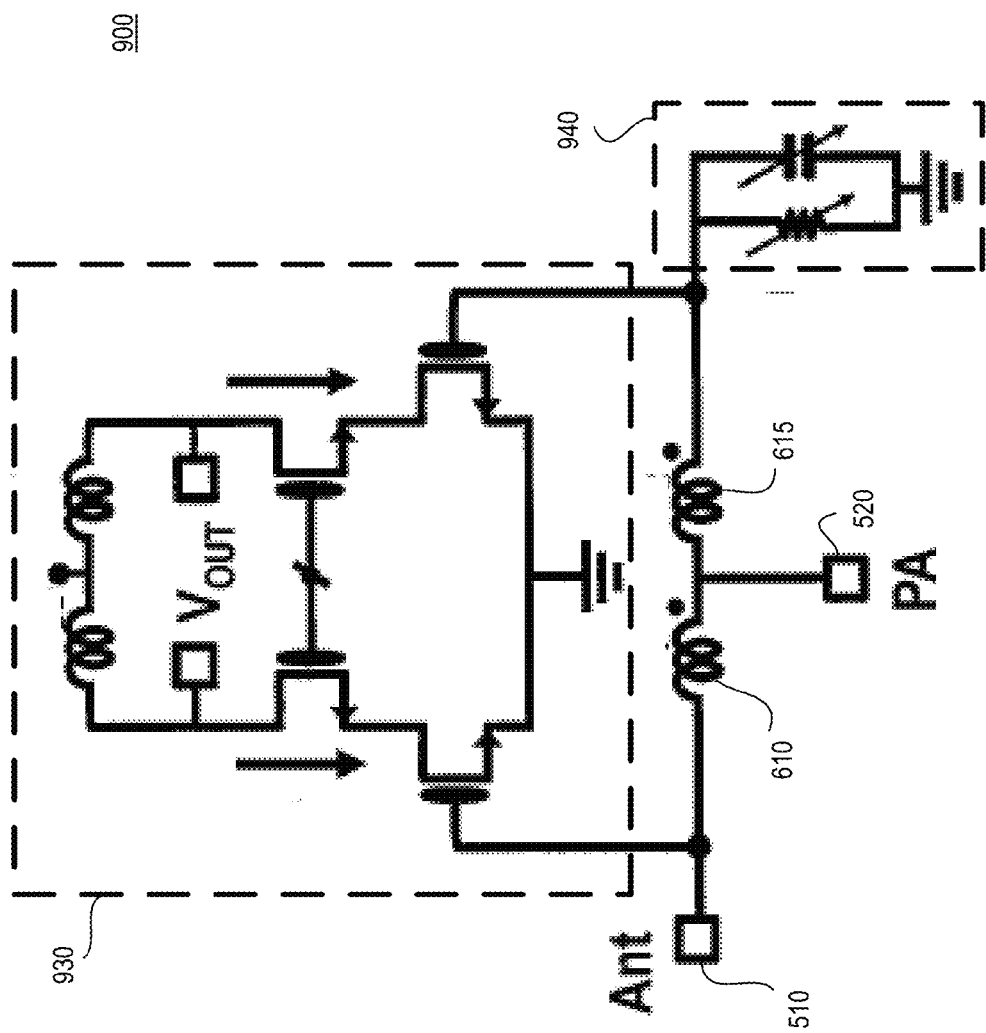
FIG. 9 is a block diagram of an example electronic device with an example duplexer system.

FIG. 9 shows an electronic device 900 which may be similar to or resemble one or more of the electronic devices 700 and 800. The electronic device 900 may have an antenna 510, a power amplifier 520, a low noise amplifier 930, inductors 610 and 615 of a duplexer 505, and a balancing network 940. The duplexer 505 may or may not be directly connected to the antenna 510 without any matching elements. The balancing network 940 may be a passive balancing network, such as the balancing network 740, or may be an active balancing network, such as the balancing network 840.

The electronic device 900 shows one possible set of circuitry for the low noise amplifier 530. The electronic device 900 may differ from the electronic devices 700 and 800 in that the low noise amplifier 930 of the electronic device 900 may be or have a common source low noise amplifier 930, rather than an impedance matched low noise amplifier 530. The common source low noise amplifier 930 may offer, for example, 6 dB more gain than an impedance-matched low noise amplifier. Additionally, in the electronic device 900, both the duplexer 505 and the low noise amplifier 930 may be integrated on the same chip.

The components of the electronic device 900 may be integrated on a prototype chip that may integrate the inductors 610 and 615, the low noise amplifier 930, the balancing network 940, and digital control circuitry. For example, the components of the electronic device 900 may be fabricated in a TSMC 65 nm CMOS technology, with the duplexer 505 occupying an area of 0.2 mm$^2$ dominated by the two inductors—one being the duplexer autotransformer, and the other being the LNA load. Various other examples of circuitry for a low noise amplifier 530 are possible.

The electronic devices 500, 700, 800, and 900 with the balancing networks 540, 740, 840, and 940 may allow a duplexer system to operate, duplex, or otherwise process many different frequencies that may be communicated with the antenna 510. The multi-band duplexer systems in the electronic devices 500, 700, and 800 may isolate the power amplifier 520 and the low noise amplifier 530 for many different frequencies and antenna impedances. The duplexer system 550 may provide for a reduction in a number of duplexers needed for an electronic device communicating over many different frequencies, and provides increased flexibility in electronic device design.

In some instances, it may be desirable or required to emit, with the antenna 510, a signal with a large power swing generated by the power amplifier 520. For example, an electronic device may communicate (such as transmit or receive) using signals with large power swings, such as, for example, plus-or-minus 7.5 V, or 15 V peak-to-peak. An example may be a cellular phone operating at a 3G standard that may specify a maximum output power level of 24 dBm at the antenna 510 for a typical peak-to-average ratio of 3.2 dB, with an antenna peak-to-peak voltage of about 15 V. In devices which may operate with large power outputs, it may be desirable to provide a balancing network that does not expose some of its components to large voltages needed by the antenna 510.

Figure 10:
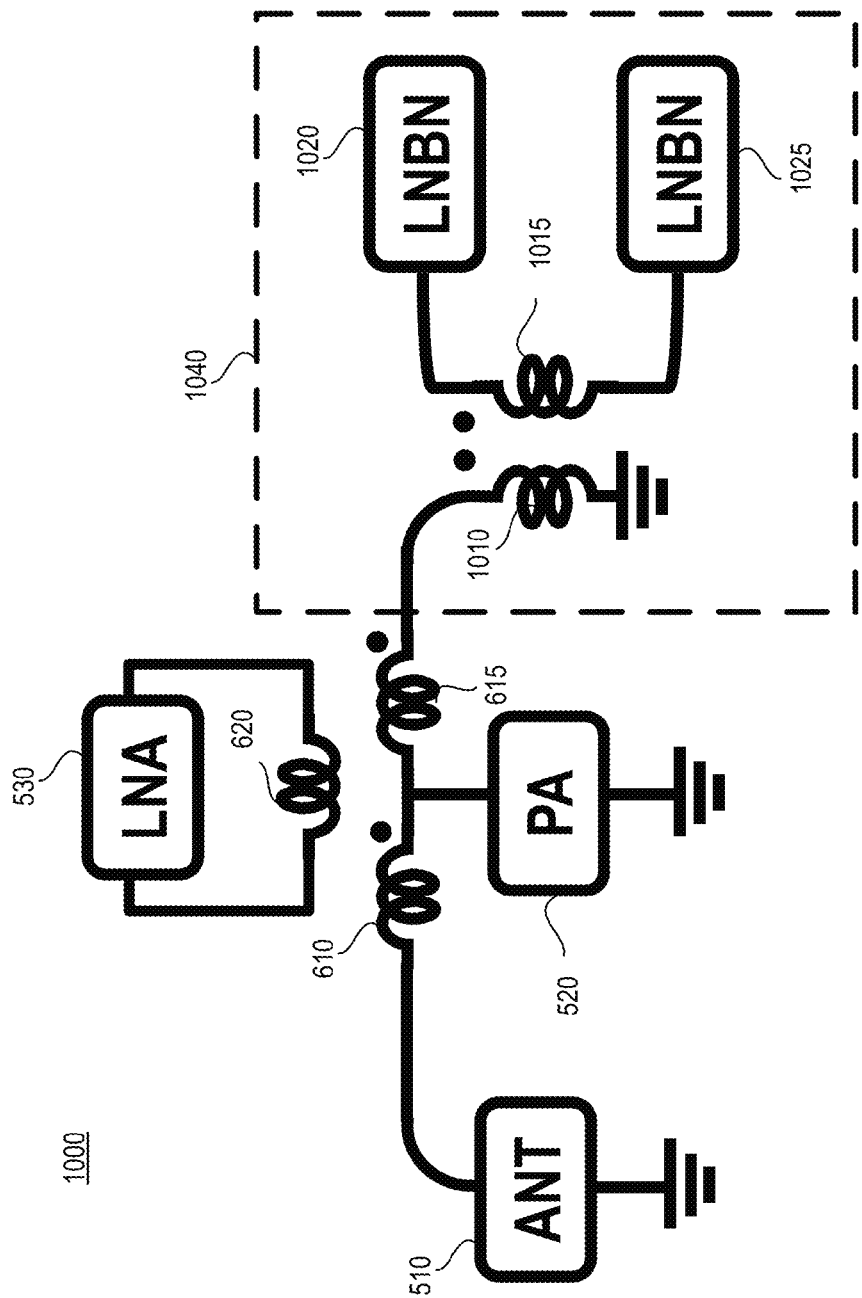
FIG. 10 is a block diagram of an example electronic device with an example duplexer system.

FIG. 10 illustrates an example electronic device 1000 with a balancing network 1040 that may be used with large power supplies without damaging components of the balancing network 1040. The electronic device 1000 may be similar, resemble, or include some of the features of electronic devices 500, 700, 800, or 900. For example, the electronic device 1000 may include an antenna 510, a power amplifier 520, a low noise amplifier 530, and inductors 610, 615, and 620.

The duplexer system of the electronic device 1000 may additionally include a balancing network 1040 which may account for large voltages and large signals. The balancing network 1040 may include one or more transformers or inductors 1010 and 1015. Where the electronic device 1000 and antenna 510 communicate large signals having large power or voltage levels or swings, such as plus-or-minus 7.5 V, an equivalent voltage drop (when the inductors 610 and 615 are identical) or a similar voltage drop (otherwise) may occur over the inductor 1010. By using inductors 1010 and 1015 as a transformer, the inductors 1010 and 1015 may operate to drop a voltage from a first voltage level V1 over the inductor 1010 (such as plus-or-minus 7.5 V) to a second voltage level V2 over the inductor 1015 which may be a fraction of the first voltage level. In some examples, the voltage may be, for example, halved through the use of the inductors 1010 and 1015. The voltage ratio V1:V2 may, for example, be the same as or reflect the difference in the number of turns in the inductor 1010 (N1) to the number of turns in the inductor 1015 (N2). In other examples, other transformers may be implemented in the balancing network to step down the voltage from the duplexer or inductor 615, or the voltage may be reduced in other ways and by other amounts.

The balancing network 1040 may additionally include one or more low noise balancing networks (sometimes referred to as "balancing circuits"). For example, the balancing network 1040 is shown in FIG. 10 as including low noise balancing networks 1020 and 1025. Each of the two low noise balancing networks 1020 and 1025 may be attached or connected to one end of the inductor 1015 of the transformer. The low noise balancing networks 1020 and 1025 may be the same or identical, or may be different from each other.

Each of the low noise balancing networks 1020 and 1025 may be the same as, resemble, or include one or more components also included in the balancing network 740, 840, or 940. For example, the low noise balancing network 1020 or 1025 may include one or more adjustable or modifiable capacitors, resistors, and switches, as well as one or more active transistors, such as in the balancing network 940. In some systems, the low noise balancing networks 1020 and 1025 are each substantially the same active balancing networks, and both may be substantially the same as the active balancing network 940. Other variations are possible.

The impedance of each of the low noise balancing networks 1020 and 1025 may be adjusted or modified in parallel or otherwise at the same time and in the same amount, or may be controlled and modified separately and differently. In some implementations, the low noise balancing networks 1020 and 1025 may not be low noise, and may be simply referred to as balancing networks or balancing circuits. Other variations are possible.

By connecting a low noise balancing network 1020 or 1025 on each end of the inductor 1015, the voltage at each of the low noise balancing networks 1020 and 1025 may be cut in half or otherwise reduced. Stepping down the voltage applied to the components of the balancing network 1040 may protect the components of the balancing networks 1020 and 1025 from being damaged.

For example, a voltage drop of plus-or-minus 7.5 V observed at the inductor 1010 may be reduced by, for example, a factor of 4 (halved at the inductor 1015; and halved again by using two balancing networks 1020 and 1025), and generate a voltage for the balancing networks of less than 2 V. A reduction in voltages at the balancing networks 1020 and 1025 may be especially valuable, for example, where the balancing networks are composed of or otherwise include CMOS switches or other CMOS technology which may not otherwise tolerate large voltage levels. Additionally, with a smaller voltage applied to the components of the balancing network 1040, the balancing network 1040 increases a power and size of a signal that the duplexer system of electronic device 1000 can communicate. This may allow the electronic device 1000 to communicate large signals and operate at a high voltage level. Other examples and benefits are possible.

Figure 11:
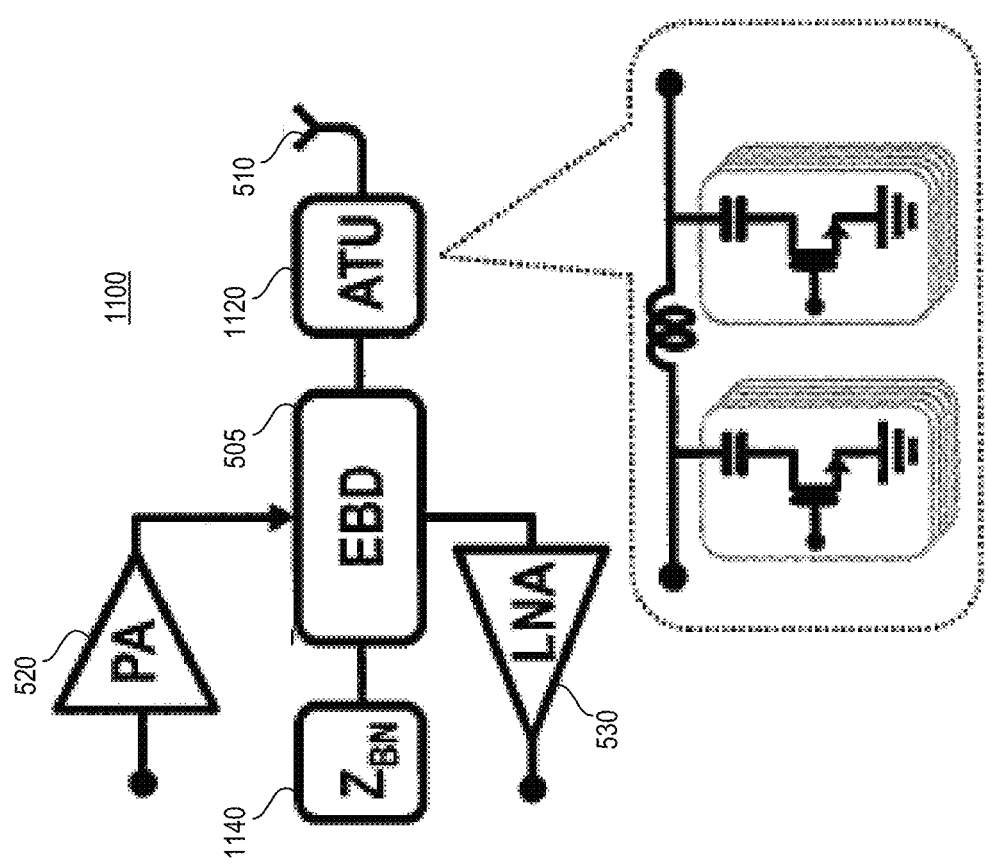
FIG. 11 is a block diagram of an example electronic device with an example duplexer system.

FIG. 11 illustrates another example of an electronic device 1100. The electronic device 1100 may be similar, resemble, or include some of the features of electronic devices 500, 700, 800, 900, or 1000. For example, the electronic device 1100 may include an antenna 510, a power amplifier 520, a low noise amplifier 530, and a duplexer 505. The electronic device 1100 may also include one or more balancing networks 1140. The balancing network 1140 may be similar to or resemble any of the balancing networks 540, 740, 840, 940, or 1040, or may be different.

The electronic device 1100 may include an antenna tuning unit ("ATU") 1120. The antenna tuning unit 1120 may be used, for example for tracking and providing a tuning of an impedance of an antenna 510.

Figure 12:
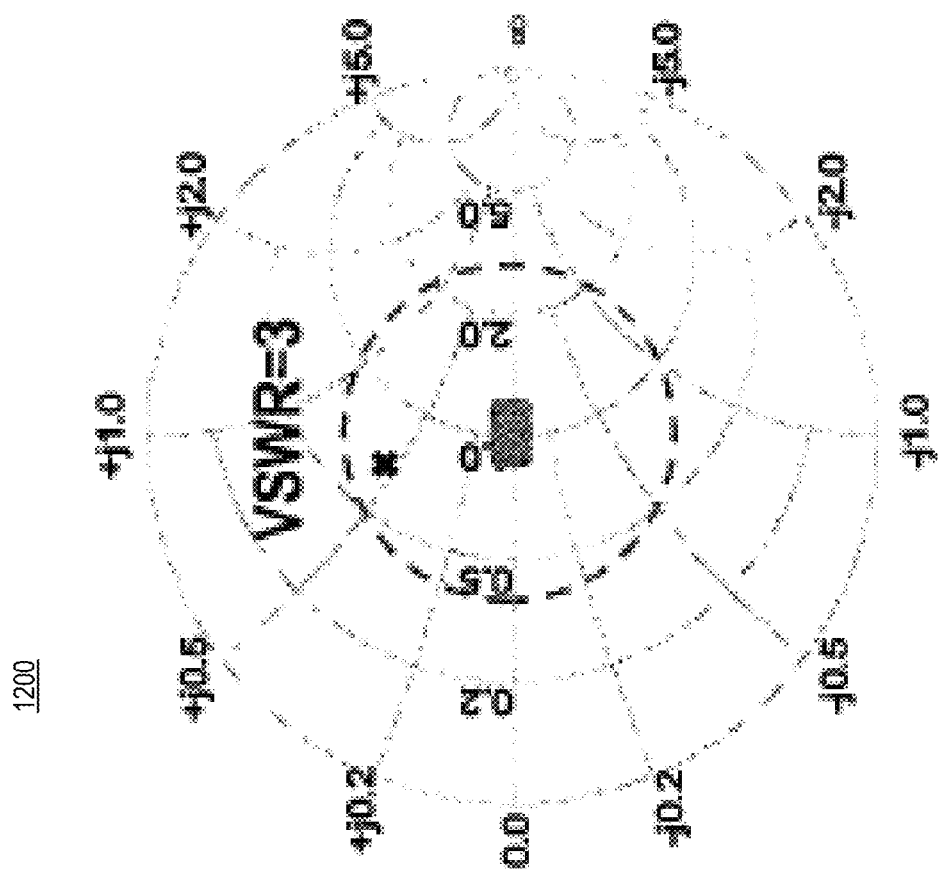
FIG. 12 is a diagram of an example Smith chart.

An antenna impedance may change slowly as a near-field of the antenna 510 is perturbed or changed. In some systems, one or more industry specifications may specify an acceptable antenna impedance variation. For example, an industry specification may specify a voltage standing wave ratio (VSWR) of 3:1 for an antenna impedance variation. FIG. 12 shows an example of a Smith chart 1200 showing impedances and a VSWR circle. In this case, an antenna impedance may lie anywhere inside the VSWR=3 circle on the Smith chart 1200. In some instances, a balancing network 1140 may be configured and operable to track impedance variations of an antenna 510 around a center of the Smith chart 1200 with fine resolution.

The antenna tuning unit 1120 may be used to provide a coarse tuning across an entire VSWR=3 area of a Smith Chart 1200. For example, the antenna tuning unit 1120 may be implemented as a pi network, with an off-chip inductor and two on-chip capacitor banks. The antenna tuning unit 1120 may be added to improve the efficiency of the power amplifier 520 and protect the power amplifier 520 from breakdown under one or more antenna mismatch conditions. As an example, where the impedance of the antenna 510 has changed to the value represented by the cross on the Smith chart in FIG. 12, the antenna tuning unit 1120 may transform the antenna impedance into the shaded area, where the balancing network 1140 can balance the duplexer 505.

In other electronic devices, the antenna tracking unit 1120 may be configured in various other ways. In other electronic devices, a balancing network 1140 may be designed and operate to cover an entire VSWR=3 area, such that an antenna tuning unit may not be necessary or included in the electronic devices. Other variations are possible.

Figure 13:
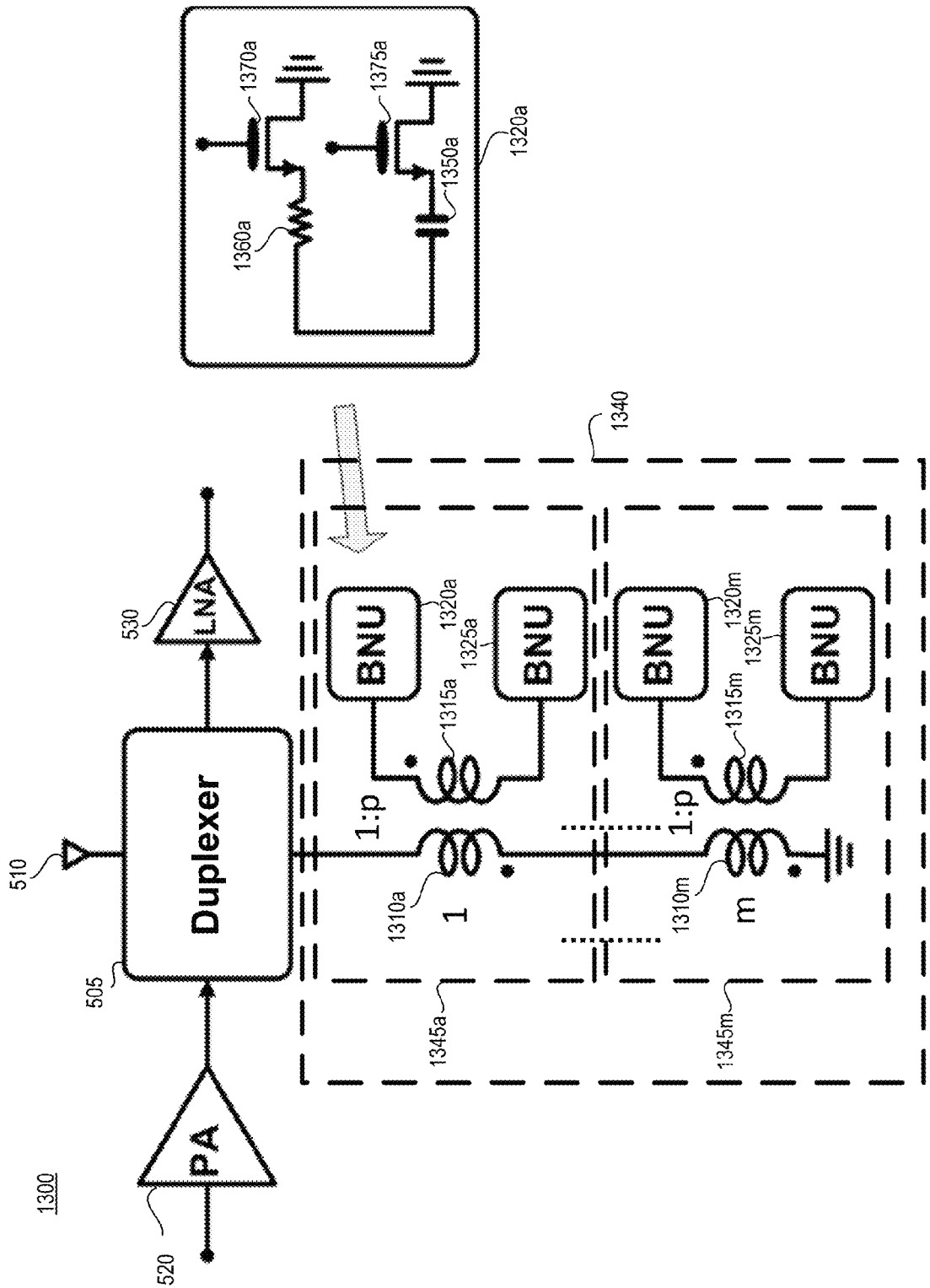
FIG. 13 is a block diagram of an example electronic device with an example duplexer system.

FIG. 13 illustrates another example of an electronic device 1300. The electronic device 1300 may be similar, resemble, or include some of the features of electronic devices 500, 700, 800, 900, 1000, or 1100. For example, the electronic device 1300 may include an antenna 510, a power amplifier 520, a low noise amplifier 530, and a duplexer 505. In one or more implementations, the duplexer 505 may be an electrical balance duplexer, a division frequency duplexer, or another duplexer, and/or may include inductors 610, 615, and 620.

The electronic device 1300 also includes a balancing network 1340. The balancing network 1340 may be similar to or resemble any of the balancing networks 540, 740, 840, 940, 1040, or 1140, or may be different. According to certain aspects of the subject technology, the balancing network 1340 may adjust its network impedance to match an antenna impedance of the antenna 510 (e.g., to isolate the power amplifier 520 from the low noise amplifier 530). In some aspects, the balancing network 1340 may be used with large power supplies, large voltage swings, and/or large signals without damaging components of the balancing network 1340.

The balancing network 1340 includes a plurality of balancing network modules 1345 serially coupled to the duplexer 505. For example, the balancing network modules 1345 are illustrated in FIG. 13 as 1345a through 1345m, where m can be any positive integer greater than 1. Each balancing network module 1345 includes inductors that operate as transformers (e.g., similar to the inductors 1010 and 1015). In one or more implementations, each balancing network module 1345 includes a primary inductor 1310 (e.g., illustrated in FIG. 13 as 1310a through 1310m respectively for each corresponding balancing network module 1345) and a secondary inductor 1315 (e.g., illustrated in FIG. 13 as 1315a through 1315m respectively for each corresponding balancing network module 1345). Each balancing network module 1345 further includes a balancing network unit 1320 (e.g., illustrated in FIG. 13 as 1320a through 1320m respectively for each corresponding balancing network module 1345) attached to one end of a corresponding secondary inductor 1315. Each balancing network module 1345 further includes another balancing network unit 1325 (e.g., illustrated in FIG. 13 as 1325a through 1325m respectively for each corresponding balancing network module 1345) attached to another end of a corresponding secondary inductor 1315.

According to certain aspects, each balancing network module 1345 may account for large voltages and large signals and/or may operate to match the network impedance of the balancing network 1340 to the antenna impedance of the antenna 510 (e.g., to isolate the power amplifier 520 from the low noise amplifier 530). In one or more implementations, similar to the balancing network 1040, each of the balancing network modules 1345 may be configured to receive only a portion of an output voltage from the duplexer 505 in order to account for large voltages and large signals encountered by the duplexer 505 and/or the balancing network 1340. Unlike the balancing network 1040, however, the electric device 1300 includes a plurality of balancing network modules 1345. As a result, the output voltage from the duplexer 505 may be further reduced by distributing the output voltage to a plurality of modules rather than a single module. For example, the output voltage from the duplexer 505 may be evenly distributed among the balancing network modules 1345.

According to certain aspects, each primary inductor 1310 and each corresponding secondary inductor 1315 may operate as a transformer to reduce a corresponding portion of the output voltage from the duplexer 505. In one or more implementations, each primary inductor 1310 receives a corresponding portion of the output voltage. In this regard, each corresponding secondary inductor 1315 may generate a stepped-up or a stepped-down voltage of the corresponding portion of the output voltage based on the ratio of a number of turns in each primary inductor 1310 to a number of turns in a corresponding secondary inductor 1315. For example, the voltage generated by each secondary inductor 1315 may be the number of turns in each secondary inductor 1315 times a corresponding portion of the output voltage divided by the number of turns in a corresponding primary inductor 1310. The ratio is illustrated in FIG. 13 as 1:p, where p can be any real number. If p is greater than 1, then each secondary inductor 1315 may generate a stepped-up voltage of a corresponding portion of the output voltage received by a corresponding primary inductor 1310. If p is less than 1, then each secondary inductor 1315 may generate a stepped-down voltage of a corresponding portion of the output voltage received by a corresponding primary inductor 1310.

According to certain aspects, the balancing network units 1320 and 1325 may also be referred to as balancing circuits, and may each be similar, resemble, or include some of the features of balancing networks 740, 840, 940, and/or low noise balancing networks 1020 and 1025. In some aspects, the balancing network units 1320 and 1325 may include switches (e.g., CMOS switches), resistors, capacitors, and/or other components to adjust the network impedance of the balancing network 1340. For example, the balancing network unit 1320a is illustrated in detail to the right in FIG. 13. As shown, the balancing network unit 1320a includes a resistor 1360a connected in series with a transistor 1370a. The balancing network unit 1320a also includes a capacitor 1350a connected in series with a transistor 1375a, both of which are in parallel with the resistor 1360a and the transistor 1370a. Although the balancing network unit 1320a is shown in the configuration in FIG. 13, it is understood that the balancing network unit 1320a may have a different configuration for adjusting the network impedance of the balancing network 1340. Each balancing network unit 1320 or 1325 may have the same or different configuration as the balancing network unit 1320a.

In order to prevent damage to the components of the balancing network units 1320 and 1325 from large voltages, each transformer of a balancing network module 1345 may operate to drop a corresponding received portion of the output voltage. In this regard, each secondary inductor 1315 may generate a stepped-down voltage of a corresponding portion of the output voltage (e.g., p may be less than 1). In other examples, other transformers may be implemented in the balancing network 1340 to step down the output voltage from the duplexer 505, or the voltage may be reduced in other ways and by other amounts.

According to certain aspects, the stepped-down voltage from each secondary inductor 1315 may be further reduced prior to being distributed to the balancing network units 1320 and 1325. For example, since the balancing network unit 1320 is attached to one end of a corresponding secondary inductor 1315 while a corresponding balancing network unit 1325 is attached to another end of a corresponding secondary inductor 1315, the stepped-down voltage received from a corresponding secondary inductor 1315 may be reduced because the stepped-down voltage is distributed among both a corresponding balancing network unit 1320 and a corresponding balancing network unit 1325 (e.g., the balancing network unit 1320 receives half of the stepped-down voltage while the balancing network unit 1325 receives the other half of the stepped-down voltage). In other words, each balancing network unit 1320 or 1325 may receive only a portion of the stepped-down voltage from a corresponding secondary inductor 1315. Stepping down a corresponding portion of the output voltage applied to the components of the balancing network units 1320 and 1325 may protect such components from being damaged by large signals (e.g., large voltages).

For example, a voltage drop of plus-or-minus 7.5 V observed at each secondary inductor 1315 may be reduced by a factor of 1/(2 m) (e.g., reduced by 1/m at each secondary inductor 1315; and reduced by ½ by using two balancing network units 1320 and 1325). A reduction in voltages at the balancing network units 1320 and 1325 may be especially valuable, for example, where the balancing networks are composed of or otherwise include CMOS switches or other CMOS technology which may not otherwise tolerate large voltage levels. Additionally, with a smaller voltage applied to the components of the balancing network 1340, the balancing network 1340 increases a power and a size of a signal that the duplexer system of the electronic device 1300 can communicate with. This may allow the electronic device 1300 to communicate large signals and operate at a high voltage level. Other examples and benefits are possible.

Figure 14:
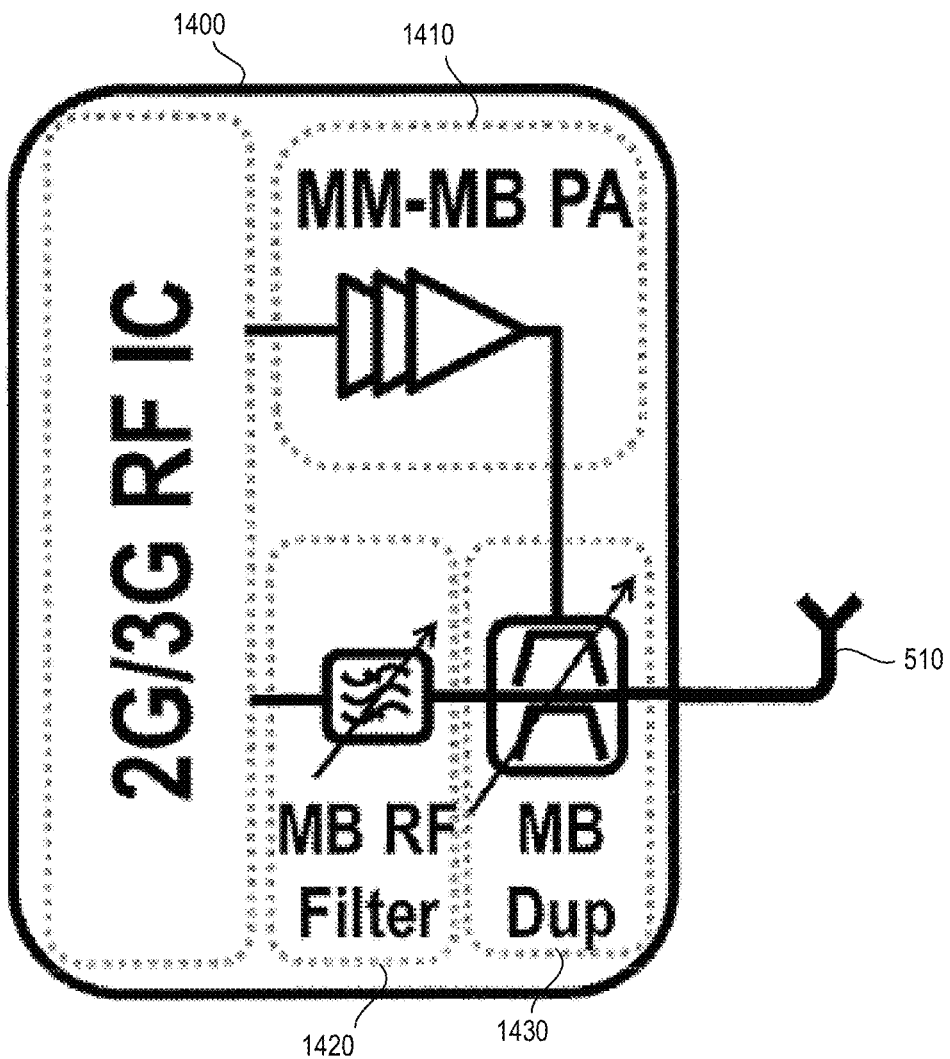
FIG. 14 is a block diagram of an example electronic device with an example duplexer system.

Various electronic devices may incorporate a duplexer system with a duplexer 505 and an active balancing network 540, 740, 840, 940, 1040, 1140, and/or 1340. FIG. 14 illustrates one example of an electronic device 1400. The electronic device may include an antenna-ready radio integrated partially or completely on a single CMOS chip. The electronic device 1400 may include one or more of a multi-mode multi-band power amplifier 1410, a multi-band RF filter 1420, and a multi-band duplexer system 1430. The multi-band RF filter 1420 may be configured or operable for use with time division duplexing ("TDD") systems such as 2G Global System for Mobile Communications ("2G GSM"). The multi-band duplexer system 1430 may be configured or operable for use with frequency division duplexing ("FDD") systems such as 3G Wideband Code Division Multiple Access ("WCDMA") systems. The multi-band duplexer systems 1430 may, for example, be, include, or represent one or more of the duplexer systems 550 and balancing networks 540, 740, 840, 940, 1040, 1140, and/or 1340 as discussed. Some or all of the components of the electronic device 1400, such as the multi-band duplexer 1430, may be manufactured and used in various other electronic devices, such as in electronic devices 100, 500, 700, 800, 900, 1000, 1100, and/or 1300 to improve efficiency, save space, and reduce costs.

In another example, an electronic device may implement the duplexer system and balancing network as a frequency independent CMOS RF duplexer for 3G/4G cellular applications. The CMOS RF duplexer may be a wideband integrated RF duplexer, which may support 3G/4G bands I, II, III, IV and IX, and may achieve a TX-to-RX isolation of more than 55 dB in a transmit-band, and greater than 45 dB in a corresponding receive-band across 200 MHz of bandwidth. A 65 nm CMOS duplexer/LNA may be implemented and achieve a transmit insertion loss of 2.5 dB, and a cascaded receiver noise figure of 5 dB with more than 27 dB of gain. Other examples and configurations of electronic devices using a duplexing system are possible.

A duplexer 505 and/or duplexer system 550 used in any of the electronic devices 500, 700, 800, 900, 1000, 1100, and/or 1300 may have various properties and expectations. For example, the duplexer 505 or duplexer system 550 may have a transceiver leakage at an associated low noise amplifier. The transceiver leakage at the LNA input may be represented as:

$$S_{leakage}(\omega)=S_{PA}(\omega)-ISO(\omega)$$

where $S_{leakage}$ is the transceiver leakage power density at receiver input in dBm/Hz, $S_{PA}$ is the power amplifier output power density in dBm/Hz, and ISO is the duplexer transceiver-to-receiver isolation in dB. Other properties and examples are possible.

For 3G applications, the duplexer 505 or duplexing system 550 in the electronic devices 500, 700, 800, 900, 1000, 1100, and/or 1300 may be configured to provide some isolation, such as 50 dB or more of isolation, in a transmitting (or transceiver) band. The duplexer 505 or duplexing system 550 may also or alternatively avoid saturating the receiver or damaging the LNA, and may relax the linearity and phase noise requirements of the receiver. The duplexer 505 or duplexing system 550 may also be configured to attenuate the noise in the receiving (or receiver) band, such as attenuating the noise by about 45 dB to push it below a receiver noise floor. In some instances, the duplexer 505 or duplexing system 550 may be configured to provide that isolation while introducing minimal insertion loss ("IL") in both the transmitter and receiver paths. For the transmitter, the power amplifier may burn or use more power to put out a higher power to overcome the transmitter insertion loss, while the receiver IL may subtract directly from receiver sensitivity. The duplexer 505 or duplexing system 550 may be configured to tolerate a large PA output swing, such as an output swing of up to 15V peak-to-peak. The duplexer 505 or duplexing system 550 may be configured to provide isolation for multiple bands, one band at a time.

Insertion loss of duplexers with SAW filters may vary from band to band. Insertion loss may vary depending on the frequency separation between a receiving frequency band and a transmitting frequency band. Insertion loss may, for example, be about 2 dB for a transmitting frequency path, and 2.5 dB for the receiving frequency path, such as, for example, because of the higher isolation requirement.

Duplexer systems, such as duplexer system 550, may incorporate one or more of the active balancing networks 840, 940, 1040, 1140, and 1340 to obtain a desired and adjustable or tunable impedance. Through the tuning of an impedance of the balancing networks 840, 940, 1040, 1140, and/or 1340, the duplexer systems may achieve an isolation of the power amplifier 520 and the low noise amplifier 530 at any signal or any frequency without assuming anything about the frequency. The active balancing networks 840, 940, 1040, 1140, and/or 1340 may achieve a lower noise for the same impedance compared to a passive implementation, and may break a theoretical 3-dB noise function performance limitation. The receiver noise figure of an electronic device using a duplexer system 550 with one or more of the active balancing networks 840, 940, 1040, 1140, and 1340 may be less than a receiver insertion loss. The active balancing networks 840, 940, 1040, 1140, and 1340 may directly improve the receiver performance, or the improvement may be distributed between the receiver and transmitter. In some implementations, the absence of any linear transconductor in the implementation may alleviate low breakdown voltages. The balancing network 1040 may be used to step down voltage levels and limit voltage swings experienced by the low noise balancing networks 920 and 925. Similarly, the balancing network 1340 may be used to step down voltage levels and limit voltage swings experienced by the balancing network units 1320 and 1325. Other benefits and advantages are possible.

Figure 15:
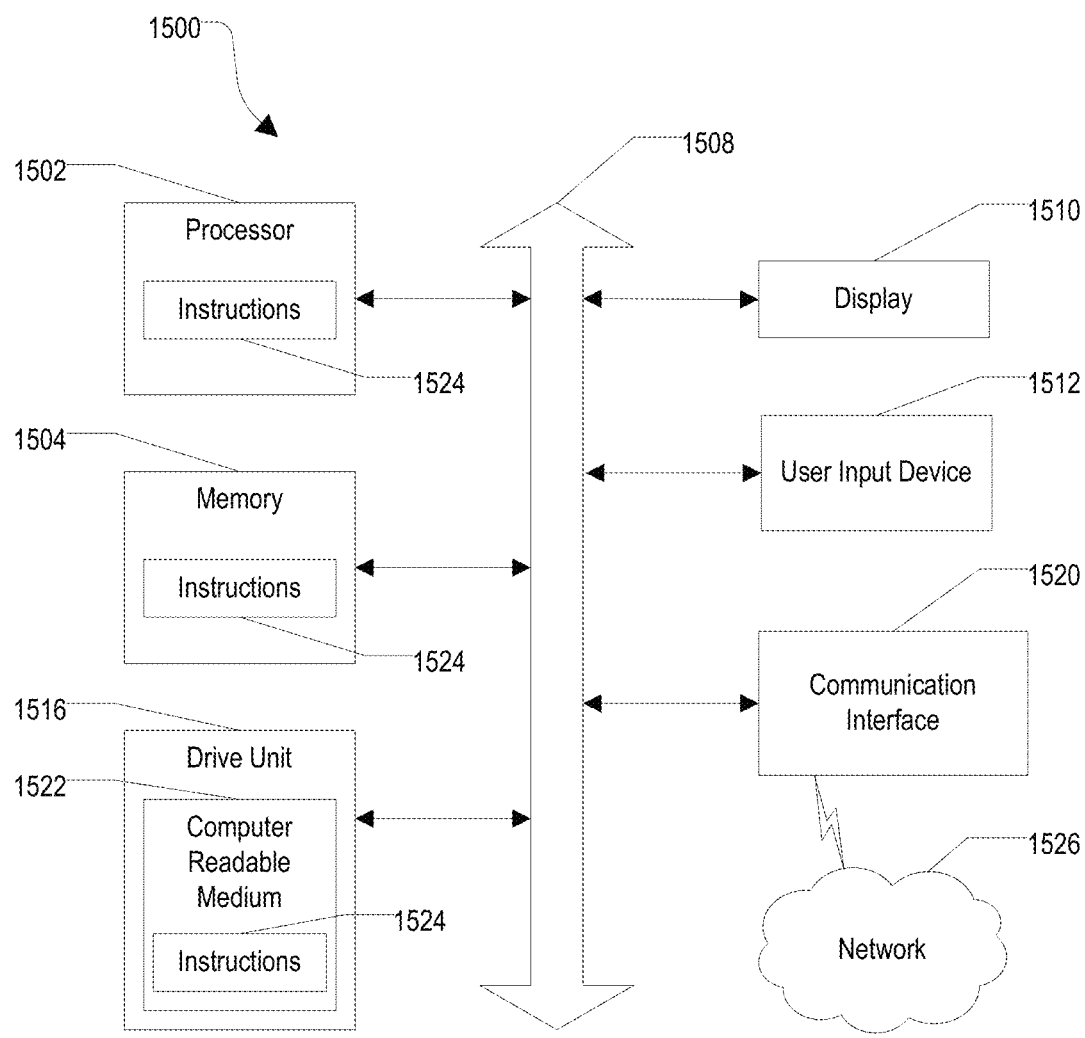
FIG. 15 is a block diagram of an example computer system that may be included with an electronic device.

One or more functions of an electronic device, such as the electronic device 100, 500, 700, 800, 900, 1000, 1100, 1300, and/or 1400 may have, include, or access a process or computer system, such as a computer system 1500 shown in FIG. 15. For example, a processor or computer system may be included with an electronic device and may be implemented to monitor an antenna impedance or adjust one or more components of a balancing network 540, 740, 840, 940, 1040, 1140, and/or 1340. Such a computer system may include a set of instructions that can be executed to cause the computer system 1500 to perform any one or more of the methods or computer based functions disclosed herein. The computer system 1500 may operate as a standalone device or may be connected, e.g., using a network, to other computer systems or peripheral devices. A computer system 1500 may also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, and/or any other machine capable of executing a set of instructions (sequential or otherwise) that specify actions to be taken by that machine.

The computer system 1500 may include a processor 1502, such as a central processing unit (CPU), a graphics processing unit (GPU), or both. The processor 1502 may be a component in a variety of systems. For example, the processor 1502 may be part of a standard personal computer or a workstation. The processor 1502 may be one or more general processors, digital signal processors, application specific integrated circuits, field programmable gate arrays, servers, networks, digital circuits, analog circuits, combinations thereof, or other now known or later developed devices for analyzing and processing data. The processor 1502 may implement a software program, such as code generated manually (i.e., programmed).

The computer system 1500 may include a memory 1504 that may communicate via a bus 1508. The memory 1504 may be a main memory, a static memory, or a dynamic memory. The memory 1504 may include, but is not limited to computer readable storage media such as various types of volatile and non-volatile storage media, including but not limited to random access memory, read-only memory, programmable read-only memory, electrically programmable read-only memory, electrically erasable read-only memory, flash memory, magnetic tape or disk, optical media and the like.

The memory 1504 may be operable to store instructions executable by the processor 1502. The functions, acts or tasks illustrated in the figures or described herein may be performed by the programmed processor 1502 executing the instructions stored in the memory 1504. The functions, acts or tasks may be independent of the particular type of instructions set, storage media, processor or processing strategy and may be performed by software, hardware, integrated circuits, firm-ware, micro-code and the like, operating alone or in combination. Likewise, processing strategies may include multiprocessing, multitasking, parallel processing and the like.

The computer system 1500 may further include a display unit 1510, such as a liquid crystal display (LCD), an organic light emitting diode (OLED), a flat panel display, a solid state display, a cathode ray tube (CRT), a projector, a printer or other now known or later developed display device for outputting determined information. The display 1510 may act as an interface for the user to see the functioning of the processor 1502, or specifically as an interface with the software stored in the memory 1504 or in the drive unit 1516.

The computer system 1500 may include an input device 1512 configured to allow a user to interact with any of the components of system 1500. The input device 1512 may be a number pad, a keyboard, or a cursor control device, such as a mouse, or a joystick, touch screen display, remote control or any other device operative to interact with the computer system 1500.

The computer system 1500 may also or alternatively include a disk or optical drive unit 1516. The disk drive unit 1516 may include a computer-readable medium 1522 in which one or more sets of instructions 1524, e.g. software, can be embedded. Further, the instructions 1524 may embody one or more of the methods or logic as described herein. The instructions 1524 may reside completely or partially within the memory 1504 and/or within the processor 1502 during execution by the computer system 1500. The memory 1504 and the processor 1502 also may include computer-readable media as discussed above.

In some systems, a computer-readable medium 1522 includes instructions 1524 or receives and executes instructions 1524 responsive to a propagated signal so that a device connected to a network 1526 can communicate voice, video, audio, images or any other data over the network 1526. Instructions 1524 may be transmitted or received over the network 1526 via a communication port or interface 1520, and/or using a bus 1508. The connection with the network 1526 may be a physical connection, such as a wired Ethernet connection or may be established wirelessly as discussed below. Likewise, the additional connections with other components of the system 1500 may be physical connections or may be established wirelessly. The network 1526 may alternatively be directly connected to the bus 1508.

While the computer-readable medium 1522 is shown to be a single medium, the term "computer-readable medium" may include a single medium or multiple media, such as a centralized or distributed database, and/or associated caches and servers that store one or more sets of instructions. The term "computer-readable medium" may also include any medium that is capable of storing, encoding or carrying a set of instructions for execution by a processor or that cause a computer system to perform any one or more of the methods or operations disclosed herein. The computer-readable medium 1522 may be non-transitory, and may be tangible.

The computer-readable medium 1522 can include a solid-state memory such as a memory card or other package that houses one or more non-volatile read-only memories. The computer-readable medium 1522 can be a random access memory or other volatile re-writable memory. Additionally or alternatively, the computer-readable medium 1522 can include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is a tangible storage medium. Accordingly, the disclosure is considered to include any one or more of a computer-readable medium or a distribution medium and other equivalents and successor media, in which data or instructions may be stored.

In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

The predicate words "configured to", "operable to", and "programmed to" do not imply any particular tangible or intangible modification of a subject, but, rather, are intended to be used interchangeably. In one or more implementations, a processor configured to analyze and control an operation or a component may also mean the processor being programmed to analyze and control the operation or the processor being operable to analyze and control the operation. Likewise, a processor configured to execute code can be construed as a processor programmed to execute code or operable to execute code.

A phrase such as "an aspect" does not imply that such aspect is essential to the subject technology or that such aspect applies to all configurations of the subject technology. A disclosure relating to an aspect may apply to all configurations, or one or more configurations. An aspect may provide one or more examples of the disclosure. A phrase such as an "aspect" may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples of the disclosure. A phrase such an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples of the disclosure. A phrase such as a "configuration" may refer to one or more configurations and vice versa.

To the extent that the term "include," "have," or the like is used in the description or the claims, such term is intended to be inclusive in a manner similar to the term "comprise" as "comprise" is interpreted when employed as a transitional word in a claim.

While various embodiments of the subject technology have been described, it will be apparent to those of ordinary skill in the art that many more embodiments and implementations are possible within the scope of the subject technology. Accordingly, the subject technology is not to be restricted except in light of the attached claims and their equivalents.

What is claimed is:

1. A power distributing duplexer system, the system comprising:
   a duplexer configured to couple an antenna to a transmitter and a receiver; and
   a balancing network coupled to the duplexer, the balancing network having a network impedance,
   wherein the balancing network is configured to adjust the network impedance to match an antenna impedance of the antenna, and
   wherein the balancing network comprises a plurality of balancing network modules coupled to the duplexer, each of the plurality of balancing network modules comprises a corresponding one or more balancing circuits, each of the balancing network modules being configured to receive a corresponding portion of an output voltage from the duplexer, reduce the received portion of the output voltage to obtain a corresponding step-down voltage, and provide at least a portion of the corresponding step-down voltage to each of the corresponding one or more balancing circuits.

2. The system of claim 1, wherein the output voltage is at least 7.5 volts.

3. The system of claim 1, wherein each of the plurality of balancing network modules comprises a corresponding transformer configured to receive the corresponding portion of the output voltage.

4. The system of claim 3, wherein the corresponding transformer of each of the plurality of balancing network modules is configured to reduce the corresponding portion of the output voltage to generate the corresponding step-down voltage.

5. The system of claim 3, wherein the corresponding transformer of each the plurality of balancing network modules is serially coupled to one another.

6. The system of claim 3, wherein the corresponding transformer of each of the plurality of network balancing modules is coupled to the corresponding one or more balancing circuits.

7. The system of claim 6, wherein the corresponding transformer of each of the plurality of network balancing modules comprises a corresponding primary inductor configured to receive the corresponding portion of the output voltage and a corresponding secondary inductor configured to generate the corresponding step-down voltage based on the corresponding portion of the output voltage.

8. The system of claim 7, wherein the corresponding secondary inductor comprises a first end and a second end, wherein the first end is coupled to a first one of the corresponding one or more balancing circuits, and wherein the second end is coupled to a second one of the corresponding one or more balancing circuits.

9. The system of claim 6, wherein each of the corresponding one or more balancing circuits comprises at least one switch.

10. The system of claim 1, wherein at least one of the plurality of balancing network modules comprises a transformer coupled to the corresponding one or more balancing circuits.

11. The system of claim 1, wherein the output voltage is evenly distributed among each of the plurality of balancing network modules.

12. The system of claim 1, wherein the transmitter comprises a power amplifier, wherein the receiver comprises a low noise amplifier, and wherein the balancing network comprises an active component.

13. The system of claim 12, wherein the balancing network is configured to match the antenna impedance and minimize a resistance of the active component.

14. The system of claim 1, wherein at least one of the plurality of balancing network modules comprises a transformer configured to reduce the received corresponding portion of the output voltage to obtain the corresponding step-down voltage.

15. A method for distributing power in a duplexer system, the method comprising:
coupling, by a duplexer, an antenna to a transmitter and a receiver;
adjusting a network impedance of a balancing network coupled to the duplexer to match an antenna impedance of the antenna, the balancing network comprising a plurality of balancing network modules coupled to the duplexer, each of the plurality of balancing network modules comprising a corresponding one or more balancing circuits;
receiving, by each of the plurality of balancing network modules, a corresponding portion of an output voltage from the duplexer;
reducing, by each of the plurality of balancing network modules, the corresponding portion of the output voltage to obtain a corresponding step-down voltage; and
providing at least a portion of the corresponding step-down voltage to each of the corresponding one or more balancing circuits.

16. The method of claim 15, wherein each of the plurality of balancing network modules comprises a corresponding transformer that receives the corresponding portion of the output voltage.

17. The method of claim 16, wherein the reducing comprises reducing, by the corresponding transformer of each of the plurality of balancing network modules, the corresponding portion of the output voltage to generate the corresponding step-down voltage.

18. The method of claim 17, wherein the corresponding transformer of each of the plurality of balancing network modules is coupled to the one or more balancing circuits.

19. The method of claim 15, wherein at least one of the plurality of balancing network modules comprises a transformer, wherein the reducing comprises reducing, by the transformer, the corresponding portion of the output voltage to obtain the corresponding step-down voltage.

20. A power distributing duplexer system, the system comprising:
a duplexer configured to couple an antenna to a transmitter and a receiver; and
a balancing network coupled to the duplexer, the balancing network having a network impedance,
wherein the balancing network is configured to adjust the network impedance to match an antenna impedance of the antenna,
wherein the balancing network comprises a plurality of transformers serially coupled to the duplexer, each of the plurality of transformers being coupled to two or more balancing circuits and being configured to receive a corresponding portion of an output voltage from the duplexer and reduce the corresponding portion of the output voltage to generate a corresponding step-down voltage, each of the two or more balancing circuits being configured to receive a portion of the corresponding step-down voltage.

\* \* \* \* \*